(12) United States Patent
Yu et al.

(10) Patent No.: US 12,044,892 B2
(45) Date of Patent: Jul. 23, 2024

(54) PACKAGE STRUCTURE INCLUDING PHOTONIC PACKAGE AND INTERPOSER HAVING WAVEGUIDE

(71) Applicant: Taiwan Semiconductor Manufacturing Co., Ltd., Hsinchu (TW)

(72) Inventors: Chen-Hua Yu, Hsinchu (TW); Hsing-Kuo Hsia, Jhubei (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 17/703,374

(22) Filed: Mar. 24, 2022

(65) Prior Publication Data

US 2023/0161120 A1    May 25, 2023

Related U.S. Application Data

(60) Provisional application No. 63/264,397, filed on Nov. 22, 2021, provisional application No. 63/266,114, filed on Dec. 29, 2021.

(51) Int. Cl.
| | | |
|---|---|---|
| *G02B 6/43* | (2006.01) | |
| *G02B 6/42* | (2006.01) | |
| (Continued) | | |

(52) U.S. Cl.
CPC ............. *G02B 6/43* (2013.01); *G02B 6/4206* (2013.01); *G02B 6/4214* (2013.01);
(Continued)

(58) Field of Classification Search
CPC ...... G02B 6/42; G02B 6/4201; G02B 6/4214; H01S 5/02251; H01S 5/02326
See application file for complete search history.

(56) References Cited

U.S. PATENT DOCUMENTS

| | | |
|---|---|---|
| 8,993,380 B2 | 3/2015 | Hou et al. |
| 9,281,254 B2 | 3/2016 | Yu et al. |
| | (Continued) | |

FOREIGN PATENT DOCUMENTS

| | | |
|---|---|---|
| KR | 20190003296 A | 1/2019 |
| KR | 20200008112 A | 1/2020 |
| | (Continued) | |

*Primary Examiner* — Daniel Petkovsek
(74) *Attorney, Agent, or Firm* — Slater Matsil, LLP

(57) ABSTRACT

A semiconductor package includes a first interposer having a first substrate, a first redistribution structure over a first side of the first substrate, and a first waveguide over the first redistribution structure and proximate to a first side of the first interposer, where the first redistribution structure is between the first substrate and the first waveguide. The semiconductor package further includes a photonic package attached to the first side of the first interposer, where the photonic package includes: an electronic die, and a photonic die having a plurality of dielectric layers and a second waveguide in one of the plurality of dielectric layers, where a first side of the photonic die is attached to the electronic die, and an opposing second side of the photonic die is attached to the first side of the first interposer, where the second waveguide is proximate to the second side of the photonic die.

20 Claims, 36 Drawing Sheets

(51) Int. Cl.
*H01S 5/02326* (2021.01)
*G02B 6/12* (2006.01)

(52) U.S. Cl.
CPC ........ *G02B 6/4274* (2013.01); *H01S 5/02326* (2021.01); *G02B 6/12002* (2013.01); *G02B 6/12004* (2013.01)

(56) References Cited

U.S. PATENT DOCUMENTS

| | | |
|---|---|---|
| 9,299,649 B2 | 3/2016 | Chiu et al. |
| 9,372,206 B2 | 6/2016 | Wu et al. |
| 9,425,126 B2 | 8/2016 | Kuo et al. |
| 9,443,783 B2 | 9/2016 | Lin et al. |
| 9,461,018 B1 | 10/2016 | Tsai et al. |
| 9,496,189 B2 | 11/2016 | Yu et al. |
| 9,666,502 B2 | 5/2017 | Chen et al. |
| 9,735,131 B2 | 8/2017 | Su et al. |
| 10,001,611 B2 * | 6/2018 | Ding .................. H01L 23/48 |
| 10,877,300 B2 * | 12/2020 | Coolbaugh ............. G02B 6/12 |
| 10,976,491 B2 * | 4/2021 | Coolbaugh ........... G02B 6/136 |
| 11,156,772 B2 | 10/2021 | Yu et al. |
| 11,435,523 B2 | 9/2022 | Coolbaugh et al. |
| 11,740,420 B2 * | 8/2023 | Bernabe ............... G02B 6/4212 385/14 |
| 2017/0186654 A1 | 6/2017 | Li |
| 2019/0004247 A1 | 1/2019 | Huang et al. |
| 2020/0166720 A1 | 5/2020 | Charles et al. |
| 2020/0319403 A1 | 10/2020 | Coolbaugh et al. |
| 2021/0072568 A1 | 3/2021 | Coolbaugh et al. |
| 2021/0091056 A1 | 3/2021 | Yu et al. |
| 2022/0043208 A1 | 2/2022 | Hsia et al. |
| 2023/0109686 A1 | 4/2023 | Yu et al. |

FOREIGN PATENT DOCUMENTS

| | | |
|---|---|---|
| KR | 20210034512 A | 3/2021 |
| TW | 201910832 A | 3/2019 |
| TW | 202002052 A | 1/2020 |
| TW | 202017195 A | 5/2020 |

\* cited by examiner

PACKAGE STRUCTURE INCLUDING PHOTONIC PACKAGE AND INTERPOSER HAVING WAVEGUIDE

PRIORITY CLAIM AND CROSS-REFERENCE

This application claims the benefits of U.S. Provisional Application No. 63/264,397, filed on Nov. 22, 2021 and entitled "Structure to Integrated Photonic Silicon on Interposer in a 3DIC Package," and U.S. Provisional Application No. 63/266,114, filed on Dec. 29, 2021 and entitled "Package Structure Including Interposer Having Waveguide," which applications are hereby incorporated herein by reference in their entireties.

BACKGROUND

Electrical signaling and processing are one technique for signal transmission and processing. Optical signaling and processing have been used in increasingly more applications in recent years, particularly due to the use of optical fiber-related applications for signal transmission.

Optical signaling and processing are typically combined with electrical signaling and processing to provide full-fledged applications. For example, optical fibers may be used for long-range signal transmission, and electrical signals may be used for short-range signal transmission as well as processing and controlling. Accordingly, devices integrating optical components and electrical components are formed for the conversion between optical signals and electrical signals, as well as the processing of optical signals and electrical signals. Packages thus may include both optical (photonic) dies including optical devices and electronic dies including electronic devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
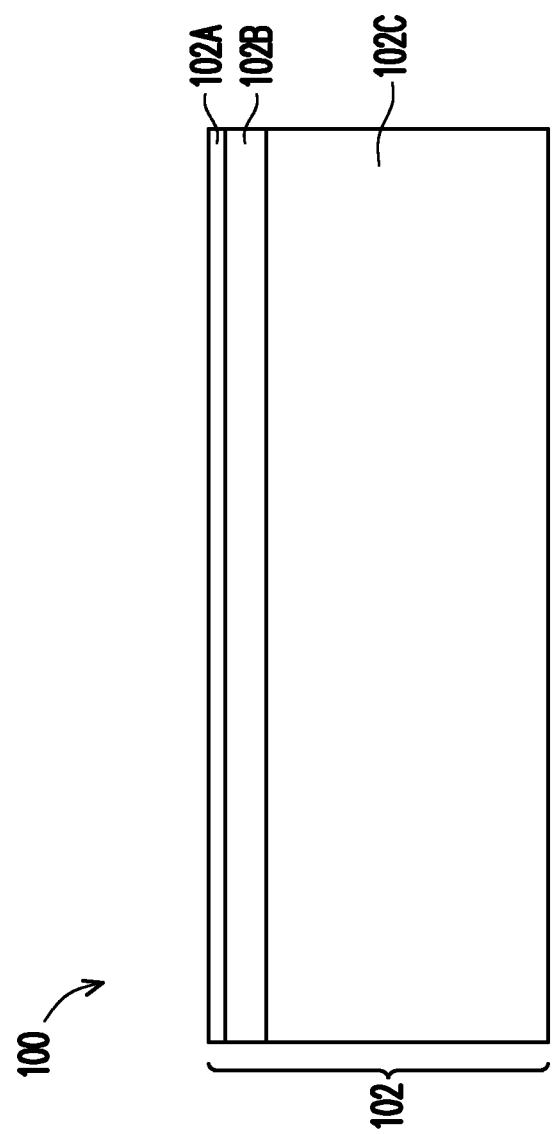
FIGS. 1 through 17 illustrate cross-sectional views of a photonic package at various stages of manufacturing, in accordance with an embodiment.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Throughout the description herein, unless otherwise specified, the same or similar reference numerals in different figures refer to the same or similar element formed by a same or similar formation method using a same or similar material(s).

In this disclosure, an interposer with an embedded waveguide (e.g., nitride waveguide) provides routing for both electrical signals and optical signals, and is used as a platform to integrate different types of devices, such as III-V devices, photonic packages/devices, and device having only electronic dies into a semiconductor package. The various embodiments of semiconductor package provide power and performance enhancement over semiconductor packages providing only electrical signal routing between different devices within the semiconductor package. The disclosed interposer allows for highly efficient edge-mount optical fiber and/or vertically-mounted optical fiber to be used in the semiconductor package for communication with external devices, and allow for greatly design flexibility. In some embodiments, one or more waveguides are integrated (e.g., embedded) in a silicon interposer of a chip-on-wafer-on-substrate (CoWoS) package, and a photonic die is disposed beside an integrated circuit die and/or a memory stacking device on the silicon interposer.

FIGS. 1 through 17 illustrate cross-sectional views of a photonic package 100 at various stages of manufacturing, in accordance with an embodiment. The photonic package 100 (also referred to as an optical engine) may be part of a semiconductor package (e.g., the semiconductor package 500 described below with reference to FIG. 25A or the like). In some embodiments, the photonic package 100 provides an input/output (I/O) interface between optical signals and electrical signals in a semiconductor package. In some embodiments, the photonic package 100 provides an optical network for signal communication between components (e.g., photonic devices, integrated circuits, couplings to external fibers, etc.) within the photonic package 100.

Turning first to FIG. 1, a buried oxide ("BOX") substrate 102 is provided, in accordance with some embodiments. The BOX substrate 102 includes an oxide layer 102B formed over a substrate 102C, and a silicon layer 102A formed over the oxide layer 102B. The substrate 102C may be, for example, a material such as a glass, ceramic, dielectric, a semiconductor, the like, or a combination thereof. In some embodiments, the substrate 102C may be a semiconductor substrate, such as a bulk semiconductor or the like, which may be doped (e.g., with a p-type or an n-type dopant) or undoped. The substrate 102C may be a wafer, such as a silicon wafer (e.g., a 12-inch silicon wafer). Other substrates, such as a multi-layered or gradient substrate may also be used. In some embodiments, the semiconductor material of the substrate 102C may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. The oxide layer 102B may be, for example, a silicon oxide or the like. In some embodiments, the oxide layer 102B may have a thickness between about 0.5 µm and about 4 µm, in some embodiments. The silicon layer 102A may have a thickness between about 0.1 µm and about 1.5 µm, in some embodiments. Other thicknesses are possible. The BOX substrate 102 may be referred to as having a front side or front surface (e.g., the side facing upwards in FIG. 1), and a back side or back surface (e.g., the side facing downwards in FIG. 1).

Figure 2:
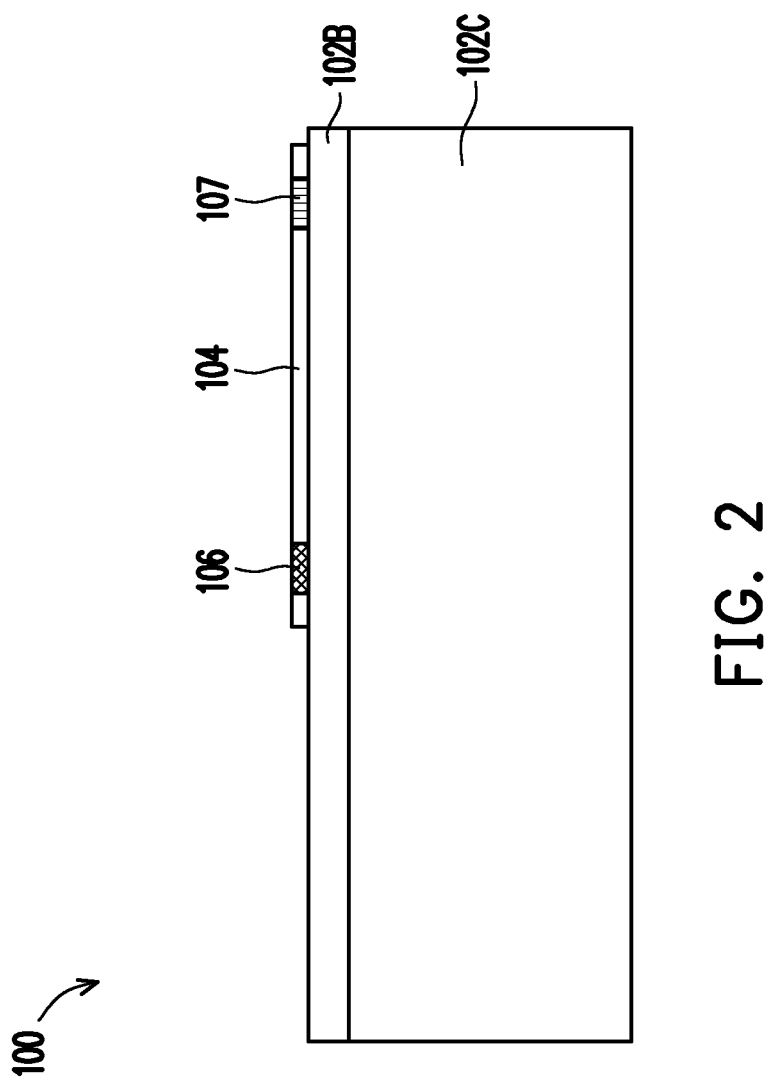

In FIG. 2, the silicon layer 102A is patterned to form silicon regions for waveguides 104, photonic components 106, and grating couplers 107, in accordance with some embodiments. The silicon layer 102A may be patterned using suitable photolithography and etching techniques. For example, a hardmask layer (e.g., a nitride layer or other dielectric material, not shown in FIG. 2) may be formed over the silicon layer 102A and patterned, in some embodiments. The pattern of the hardmask layer may then be transferred to the silicon layer 102A using an etching process. The etching process may include, for example, a dry etching process and/or a wet etching process. For example, the silicon layer 102A may be etched to form recesses defining the waveguides 104 (also referred to as silicon waveguide 104), with sidewalls of the remaining unrecessed portions defining sidewalls of the waveguides 104. In some embodiments, more than one photolithography and etching sequence may be used in order to pattern the silicon layer 102A. One waveguide 104 or multiple waveguides 104 may be patterned from the silicon layer 102A. If multiple waveguides 104 are formed, the multiple waveguides 104 may be individual separate waveguides 104 or connected as a single continuous structure. In some embodiments, one or more of the waveguides 104 form a continuous loop. Other configurations or arrangements of waveguides 104, the photonic components 106, or the grating couplers 107 are possible, and other types of photonic components 106 or photonic structures may be formed. In some cases, the waveguides 104, the photonic components 106, and the grating couplers 107 may be collectively referred to as "the photonic layer."

The photonic components 106 may be integrated with the waveguides 104, and may be formed with the silicon waveguides 104. The photonic components 106 may be optically coupled to the waveguides 104 to interact with optical signals within the waveguides 104. The photonic components 106 may include, for example, photonic devices such as photodetectors and/or modulators. For example, a photodetector may be optically coupled to the waveguides 104 to detect optical signals within the waveguides 104 and generate electrical signals corresponding to the optical signals. A modulator may be optically coupled to the waveguides 104 to receive electrical signals and generate corresponding optical signals within the waveguides 104 by modulating optical power within the waveguides 104. In this manner, the photonic components 106 facilitate the input/output (I/O) of optical signals to and from the waveguides 104. In other embodiments, the photonic components may include other active or passive components, such as laser diodes, optical signal splitters, or other types of photonic structures or devices. Optical power may be provided to the waveguides 104 by, for example, an optical fiber (see, e.g., 217A and 217B in FIG. 25A) coupled to an external light source, or the optical power may be generated by a laser diode (see, e.g., 400 in FIG. 25A).

In some embodiments, the photodetectors may be formed by, for example, partially etching regions of the waveguides 104 and growing an epitaxial material on the remaining silicon of the etched regions. The waveguides 104 may be etched using acceptable photolithography and etching techniques. The epitaxial material may comprise, for example, a semiconductor material such as germanium (Ge), which may be doped or undoped. In some embodiments, an implantation process may be performed to introduce dopants within the silicon of the etched regions as part of the formation of the photodetectors. The silicon of the etched regions may be doped with p-type dopants, n-type dopants, or a combination. In some embodiments, the modulators may be formed by, for example, partially etching regions of the waveguides 104 and then implanting appropriate dopants within the remaining silicon of the etched regions. The waveguides 104 may be etched using acceptable photolithography and etching techniques. In some embodiments, the etched regions used for the photodetectors and the etched regions used for the modulators may be formed using one or more of the same photolithography or etching steps. The silicon of the etched regions may be doped with p-type dopants, n-type dopants, or a combination. In some embodiments, the etched regions used for the photodetectors and the etched regions used for the modulators may be implanted using one or more of the same implantation steps.

In some embodiments, one or more grating couplers 107 may be integrated with the waveguides 104, and may be formed with the waveguides 104. The grating couplers 107 are photonic structures that allow optical signals and/or optical power to be transferred between the waveguides 104 and a photonic component such as a vertically-mounted optical fiber (e.g., the optical fiber 217B shown in FIG. 25A) or a waveguide of another photonic system. The grating couplers 107 may be formed using acceptable photolithography and etching techniques. In an embodiment, the grating couplers 107 are formed after the waveguides 104 are defined. For example, a photoresist may be formed on the waveguides 104 and patterned. The photoresist may be patterned with openings corresponding to the grating couplers 107. One or more etching processes may be performed using the patterned photoresist as an etching mask to form recesses in the waveguides 104 that define the grating couplers 107. The etching processes may include one or more dry etching processes and/or wet etching processes. In some embodiments, other types of couplers (not individually labeled in the figures) may be formed, such as a structure that couples optical signals between the waveguides 104 and other waveguides of the photonic package 100, such as nitride waveguides 134A (see FIG. 14). Edge couplers may also be formed that allow optical signals and/or optical power to be transferred between the waveguide 104 and a photonic component that is horizontally mounted near a sidewall of the photonic package 100. These and other photonic structures are considered within the scope of the present disclosure.

Figure 3:
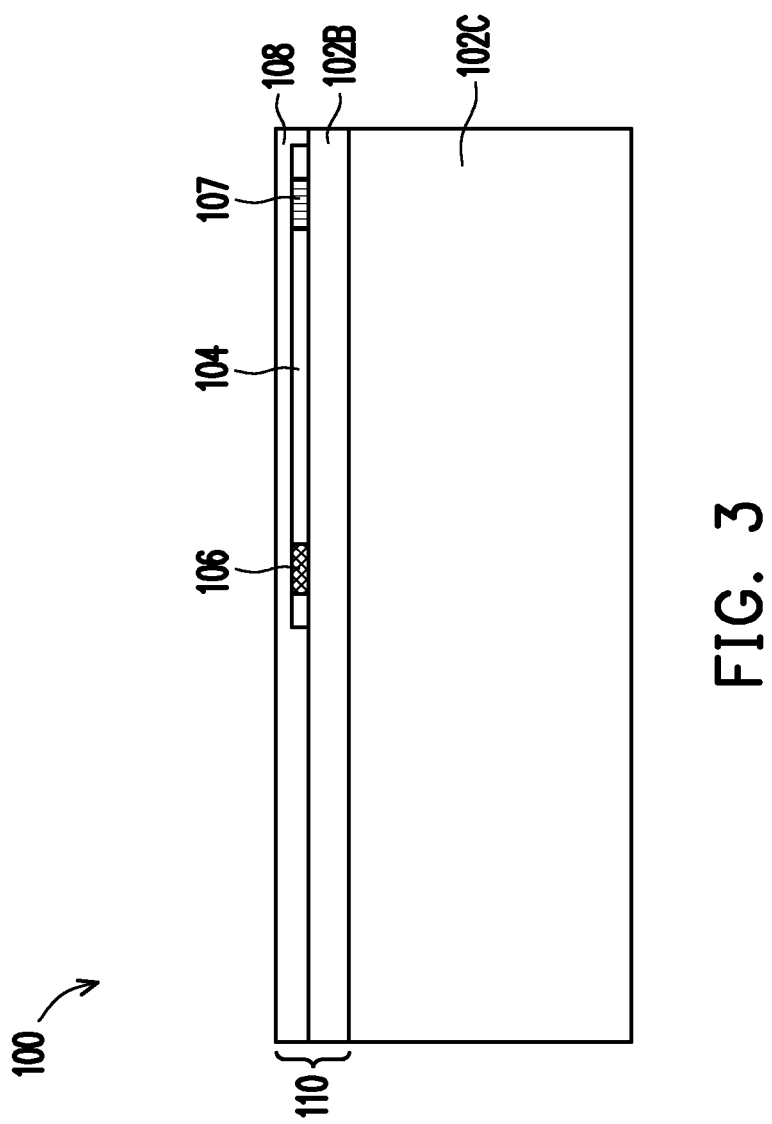

In FIG. 3, a dielectric layer 108 is formed on the front side of the BOX substrate 102 to form a photonic routing structure 110, in accordance with some embodiments. The dielectric layer 108 is formed over the waveguides 104, the photonic components 106, the grating couplers 107, and the oxide layer 102B. The dielectric layer 108 may be formed of one or more layers of silicon oxide, silicon nitride, a combination thereof, or the like, and may be formed by CVD, PVD, atomic layer deposition (ALD), a spin-on-dielectric process, the like, or a combination thereof. In some embodiments, the dielectric layer 108 may be formed by a high density plasma chemical vapor deposition (HDP-CVD), a flowable CVD (FCVD) (e.g., a CVD-based material deposition in a remote plasma system and post curing to make it convert to another material, such as an oxide), the like, or a combination thereof. Other dielectric materials formed by any acceptable process may be used. In some embodiments, the dielectric layer 108 is then planarized using a planarization process such as a CMP process, a grinding process, or the like. The dielectric layer 108 may be formed having a thickness over the oxide layer 102B between about 50 nm and about 500 nm, or may be formed having a thickness over the waveguides 104 between about 10 nm and about 200 nm, in some embodiments. In some cases, a thinner dielectric layer 108 may allow for more efficient optical coupling between a grating coupler 107 and a vertically-mounted photonic component.

Due to the difference in refractive indices of the materials of the waveguides 104 and dielectric layer 108, the waveguides 104 have high internal reflections such that light is substantially confined within the waveguides 104, depending on the wavelength of the light and the refractive indices of the respective materials. In an embodiment, the refractive index of the material of the waveguides 104 is higher than the refractive index of the material of the dielectric layer 108. For example, the waveguides 104 may comprise silicon, and the dielectric layer 108 may comprise silicon oxide and/or silicon nitride.

Figure 4:
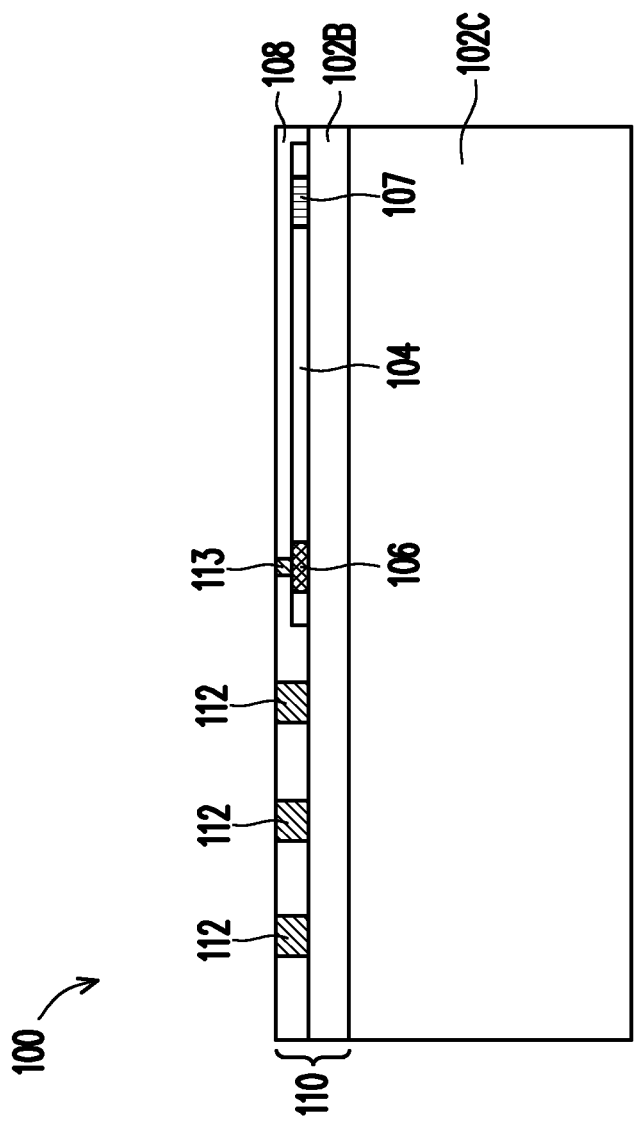

In FIG. 4, vias 112 and contacts 113 are formed in the dielectric layer 108, in accordance with some embodiments. In some embodiments, the vias 112 and contacts 113 are formed as part of forming the redistribution structure 120 (see FIG. 5), and in other embodiments, the vias 112 are not formed. In some embodiments, the vias 112 are formed by a damascene process, e.g., single damascene, dual damascene, or the like. The vias 112 may be formed, for example, by forming openings extending through the dielectric layer 108. In some embodiments, the openings may extend partially into the oxide layer 102B or fully through the oxide layer 102B to expose the substrate 102C. In some embodiments, the openings may extend partially into the substrate 102C. The openings may be formed using acceptable photolithography and etching techniques, such as by forming and patterning a photoresist and then performing an etching process using the patterned photoresist as an etching mask. The etching process may include, for example, a dry etching process and/or a wet etching process.

A conductive material may then be formed in the openings, thereby forming vias 112, in accordance with some embodiments. In some embodiments, a liner (not shown), such as a diffusion barrier layer, an adhesion layer, or the like, may be formed in the openings from TaN, Ta, TiN, Ti, CoW, or the like, and may be formed using suitable a deposition process such as ALD or the like. In some embodiments, a seed layer (not shown), which may include copper or a copper alloy may then be deposited in the openings. The conductive material of the vias 112 may be formed in the openings using, for example, a plating process. The conductive material may include, for example, a metal or a metal alloy such as copper, silver, gold, tungsten, cobalt, aluminum, or alloys thereof. A planarization process (e.g., a CMP process or a grinding process) may be performed to remove excess conductive material along the top surface of the dielectric layer 108, such that top surfaces of the vias 112 and the dielectric layer 108 are level. The vias 112 may be formed using other techniques or materials in other embodiments.

In some embodiments, the contacts 113 extend through the dielectric layer 108 and are electrically connected to the photonic components 106. The contacts 113 allow electrical power or electrical signals to be transmitted to the photonic components 106 and electrical signals to be transmitted from the photonic components 106. In this manner, the photonic components 106 may convert electrical signals into optical signals transmitted by the waveguides 104, and/or may convert optical signals from the waveguides 104 into electrical signals. The contacts 113 may be formed before or after formation of the vias 112, and the formation of the contacts 113 and the formation of the vias 112 may share some steps such as deposition of the conductive material and/or planarization. In some embodiments, the contacts 113 are formed by a damascene process, e.g., single damascene, dual damascene, or the like. For example, in some embodiments, openings (not shown) for the contacts 113 are first formed in the dielectric layer 108 using acceptable photolithography and etching techniques. A conductive material may then be formed in the openings, forming the contacts 113. Excess conductive material may be removed using a CMP process or the like. The conductive material of the contacts 113 may be formed of a metal or a metal alloy including aluminum, copper, tungsten, or the like, which may be the same as that of the vias 112. The contacts 113 may be formed using other techniques or materials in other embodiments.

Figure 5:
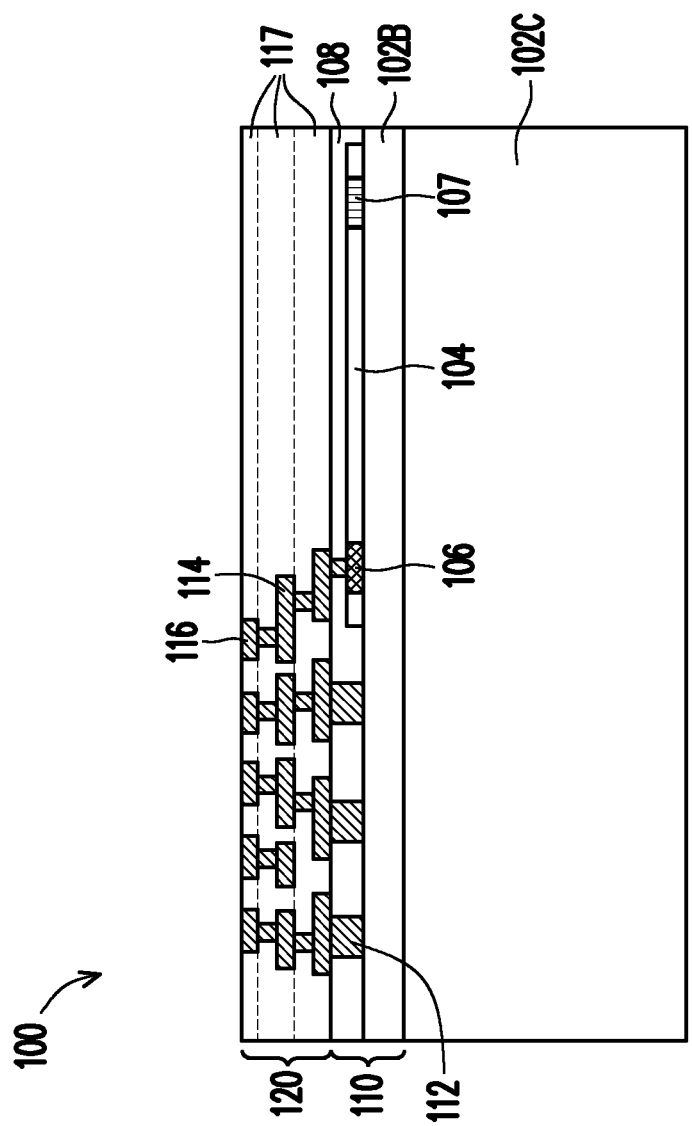

In FIG. 5, a redistribution structure 120 is formed over the dielectric layer 108, in accordance with some embodiments. The redistribution structure 120 includes dielectric layers 117 and conductive features 114 formed in the dielectric layers 117 that provide interconnections and electrical routing. For example, the redistribution structure 120 may connect the vias 112, the contacts 113, and/or overlying devices such as electronic dies 122 (see FIG. 8). The dielectric layers 117 may be, for example, insulating or passivating layers, and may comprise one or more materials similar to those described above for the dielectric layer 108, such as a silicon oxide or a silicon nitride, or may comprise a different material. The dielectric layers 117 and the dielectric layer 108 may be transparent or nearly transparent to light within the same range of wavelengths. The dielectric layers 117 may be formed using a technique similar to those described above for the dielectric layer 108 or using a different technique. The conductive features 114 may include conductive lines and vias, and may be formed by a damascene process, e.g., single damascene, duel damascene, or the like. As shown in FIG. 5, conductive pads 116 are formed in the topmost layer of the dielectric layers 117. A planarization process (e.g., a CMP process or the like) may be performed after forming the conductive pads 116 such that surfaces of the conductive pads 116 and the topmost dielectric layer 117 are substantially coplanar. The redistribution structure 120 may include more or fewer dielectric layers 117, conductive features 114, or conductive pads 116 than shown in FIG. 5. The redistribution structure 120 may be formed having a thickness between about 4 µm and about 8 µm, in some embodiments. Other thicknesses are possible.

Figure 6:
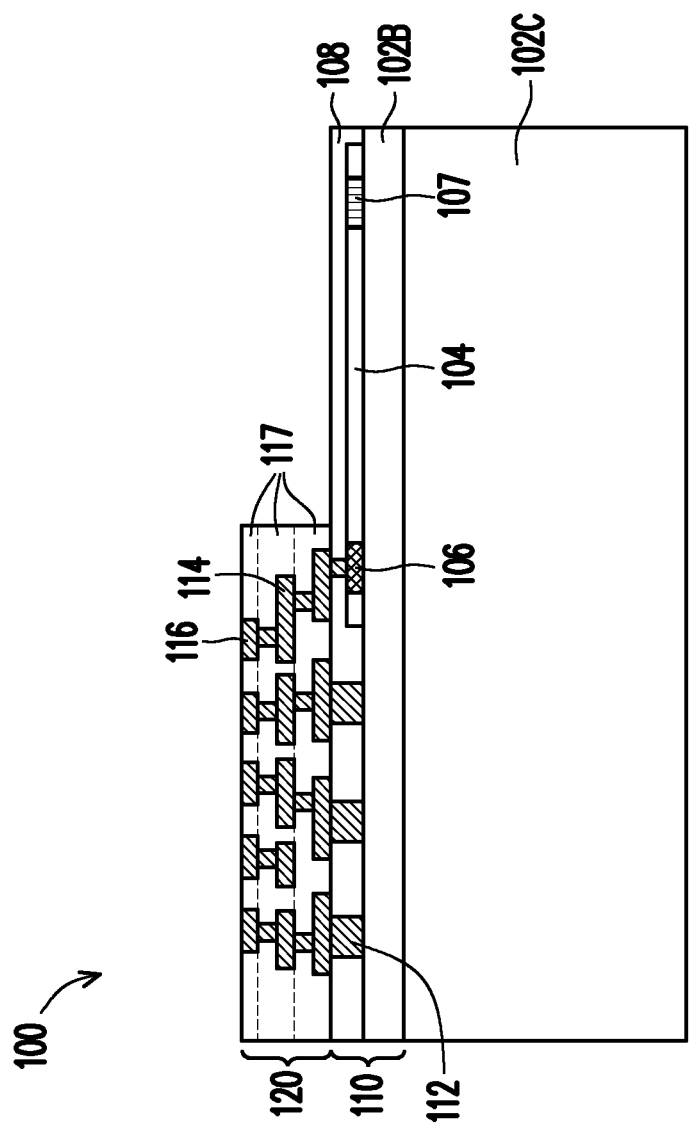
Figure 7:
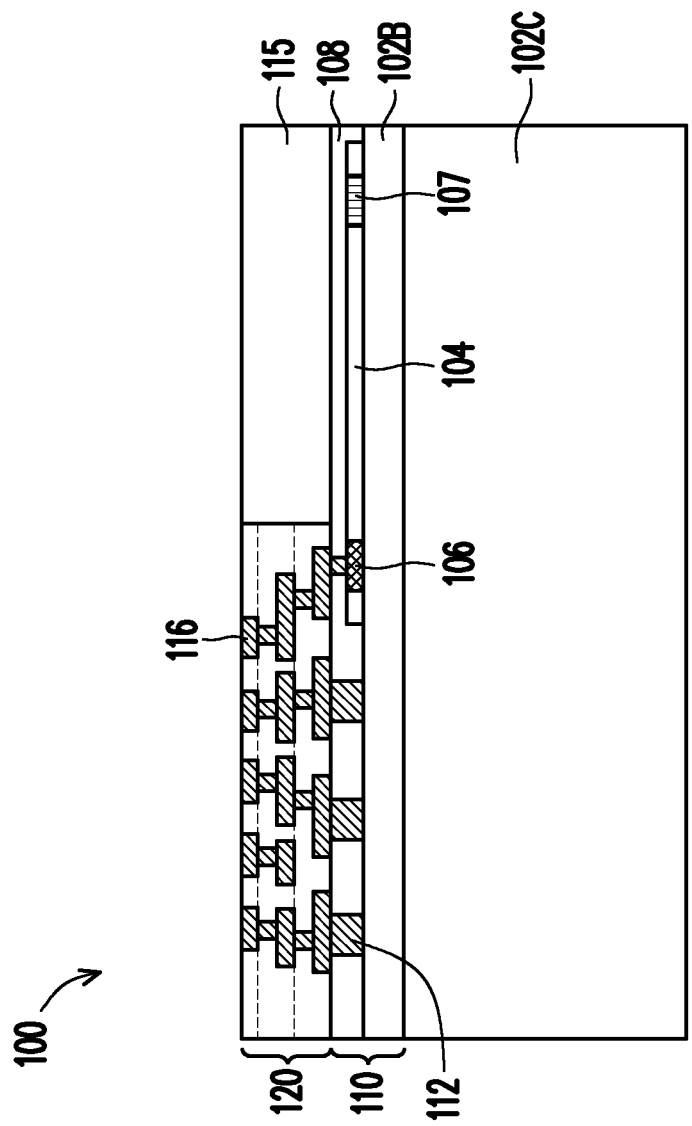

In FIGS. 6 and 7, a portion of the redistribution structure 120 is removed and replaced by a dielectric layer 115, in accordance with some embodiments. The removed portion of the redistribution structure 120 may be above or approximately above a grating coupler 107, in some cases. The material of the dielectric layer 115 may provide more efficient optical coupling between a grating coupler 107 and a vertically-mounted optical fiber (see optical fiber 217B in FIG. 25A) than the material of the dielectric layers 117 of the redistribution structure 120. For example, the dielectric layer 115 may be more transparent, less lossy, or less reflective than the dielectric layers 117. In some embodiments, the material of the dielectric layer 115 is similar to that of the dielectric layers 117, but is deposited using a technique that forms the material having a better quality (e.g., less impurities, dislocations, etc.). In this manner, replacing a portion of the dielectric layers 117 of the redistribution structure 120 with the dielectric layer 115 may allow for more efficient operation of the photonic package 100, and may reduce optical signal loss.

Referring to FIG. 6, the portion of the redistribution structure 120 may be removed, for example, using acceptable photolithography and etching techniques, such as by forming and patterning a photoresist and then performing an etching process to remove the dielectric layers 117 using the patterned photoresist as an etching mask. The etching process may include, for example, a dry etching process and/or a wet etching process.

Turning to FIG. 7, the dielectric layer 115 is deposited to replace the removed portion of the redistribution structure 120. The dielectric layer 115 may comprise one or more materials similar to those described above for the dielectric layer 108, such as a silicon oxide or a silicon nitride, a spin-on glass, or a different material. The dielectric layer 115 and the dielectric layer 108 may be transparent or nearly transparent to light within the same range of wavelengths. The dielectric layer 115 may be formed using a technique similar to those described above for the dielectric layer 108 or using a different technique. For example, the dielectric layer 115 may be formed using CVD, PVD, spin-on, or the like, though another technique may be used. In some embodiments, a planarization process (e.g., a CMP or grinding process) is used to remove excess material of the dielectric layer 115. The planarization process may also expose the conductive pads 116. After performing the planarization process, the dielectric layer 115, the topmost dielectric layer 117, and/or the conductive pads 116 may have substantially level surfaces.

In other embodiments, the redistribution structure 120 is not etched and the dielectric layer 115 is not formed. In these embodiments, regions of the redistribution structure 120 may be substantially free of the conductive features 114 or conductive pads 116 in order to allow transmission of optical power or optical signals through the dielectric layers 117. For example, these metal-free regions may extend between a grating coupler 107 and a vertically-mounted optical fiber (see optical fiber 217B in FIG. 25A) to allow optical power or optical signals to be coupled between the waveguides 104 and the optical fiber. In some cases, a thinner redistribution structure 120 may allow for more efficient optical coupling between a grating coupler 107 and a vertically-mounted optical fiber.

Figure 8:
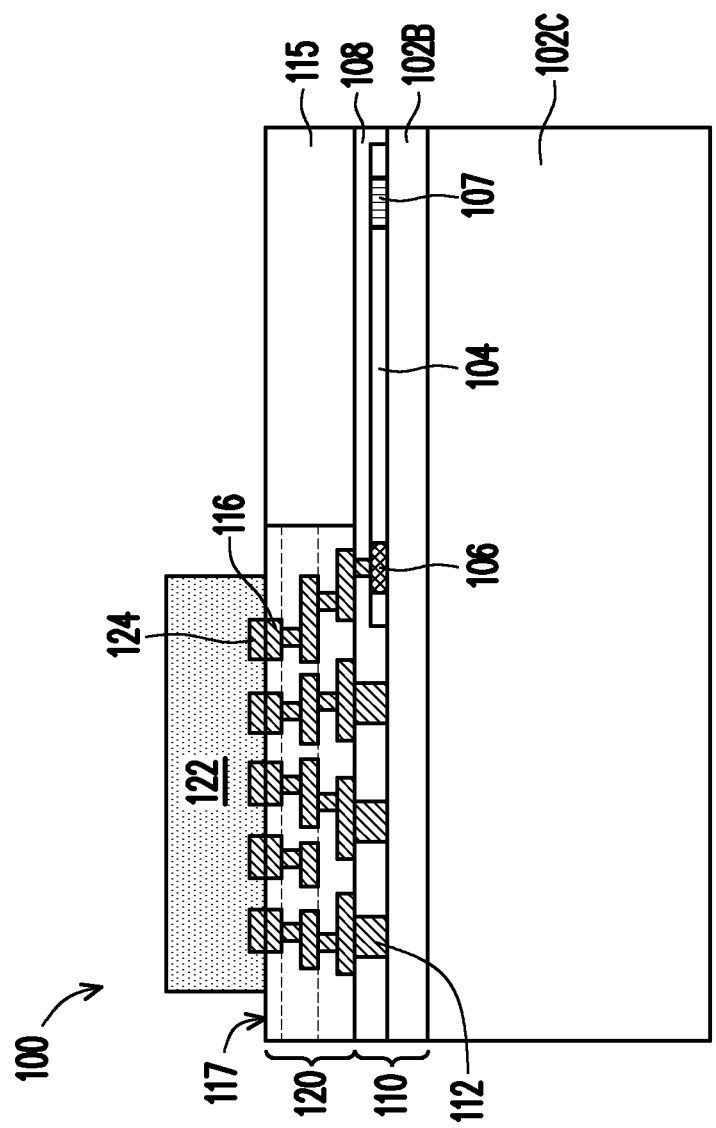

In FIG. 8, one or more electronic dies 122 are bonded to the redistribution structure 120, in accordance with some embodiments. The electronic die 122 may be, for example, semiconductor devices, dies, or chips that communicate with the photonic components 106 using electrical signals. In the illustrated embodiments, the electronic die 122 does not receive, transmit, or process optical signals. In the discussion herein, the term "electronic die" is used to distinguish from "photonic die" (see, e.g., 151 in FIG. 17), which refers to a die that can receive, transmit, or process optical signals, such as converting an optical signal into an electric signal, or vice versa. Besides optical signals, the photonic die may also transmit, receive, or process electrical signals. One electronic die 122 is shown in FIG. 8, but a photonic package 100 may include two or more electronic dies 122 in other embodiments. In some cases, multiple electronic dies 122 may be incorporated into a single photonic package 100 in order to reduce processing cost. The electronic die 122 includes die connectors 124, which may be, for example, conductive pads, conductive pillars, or the like. In some embodiments, the electronic die 122 may have a thickness between about 10 µm and about 35 µm, such as about 25 µm. Other thicknesses are possible.

The electronic die 122 may include integrated circuits for interfacing with the photonic components 106, such as circuits for controlling the operation of the photonic components 106. For example, the electronic die 122 may include controllers, drivers, transimpedance amplifiers, the like, or combinations thereof. The electronic die 122 may also include a CPU, in some embodiments. In some embodiments, the electronic die 122 includes circuits for processing electrical signals received from photonic components 106, such as for processing electrical signals received from a photonic component 106 comprising a photodetector. The electronic die 122 may control high-frequency signaling of the photonic components 106 according to electrical signals (digital or analog) received from another device or die, in some embodiments. In some embodiments, the electronic die 122 may be an electronic integrated circuit (EIC) or the like that provides Serializer/Deserializer (SerDes) functionality. In this manner, the electronic die 122 may act as part of an I/O interface between optical signals and electrical signals within a photonic package 100. In some embodiments, the photonic packages 100 described herein could be considered system-on-chip (SoC) or system-on-integrated-circuit (SoIC) devices.

In some embodiments, the electronic die 122 is bonded to the redistribution structure 120 by dielectric-to-dielectric bonding and/or metal-to-metal bonding (e.g., direct bonding, fusion bonding, oxide-to-oxide bonding, hybrid bonding, or the like). In such embodiments, covalent bonds may be formed between oxide layers, such as the topmost dielectric layer 117 and surface dielectric layers (not shown) of the electronic die 122. During the bonding, metal bonding may also occur between the die connectors 124 of the electronic die 122 and the conductive pads 116 of the redistribution structure 120.

In some embodiments, before performing the bonding process, a surface treatment is performed on the electronic die 122. In some embodiments, the top surfaces of the redistribution structure 120 and/or the electronic die 122 may first be activated utilizing, for example, a dry treatment, a wet treatment, a plasma treatment, exposure to an inert gas, exposure to H₂, exposure to N₂, exposure to O₂, the like, or combinations thereof. However, any suitable activation process may be utilized. After the activation process, the redistribution structure 120 and/or the electronic die 122 may be cleaned using, e.g., a chemical rinse. The electronic die 122 is then aligned with the redistribution structure 120 and placed into physical contact with the redistribution structure 120. The electronic die 122 may be placed on the redistribution structure 120 using a pick-and-place process, for example. The redistribution structure 120 and the electronic die 122 may then be subjected to a thermal treatment and/or pressed against each other (e.g., by applying contact pressure) to bond the redistribution structure 120 and the electronic die 122. For example, the redistribution structure 120 and the electronic die 122 may be subjected to a pressure of about 200 kPa or less, and to a temperature between about 200° C. and about 400° C. The redistribution structure 120 and the electronic die 122 may then be subjected to a temperature at or above the eutectic point of the material of the conductive pads 116 and the die connectors 124 (e.g., between about 150° C. and about 650° C.) to fuse the conductive pads 116 and the die connectors 124. In this manner, the dielectric-to-dielectric bonding and/or metal-to-metal bonding of the redistribution structure 120 and the electronic die 122 forms a bonded structure. In some embodiments, the bonded structure is baked, annealed, pressed, or otherwise treated to strengthen or finalize the bonds.

Figure 9:
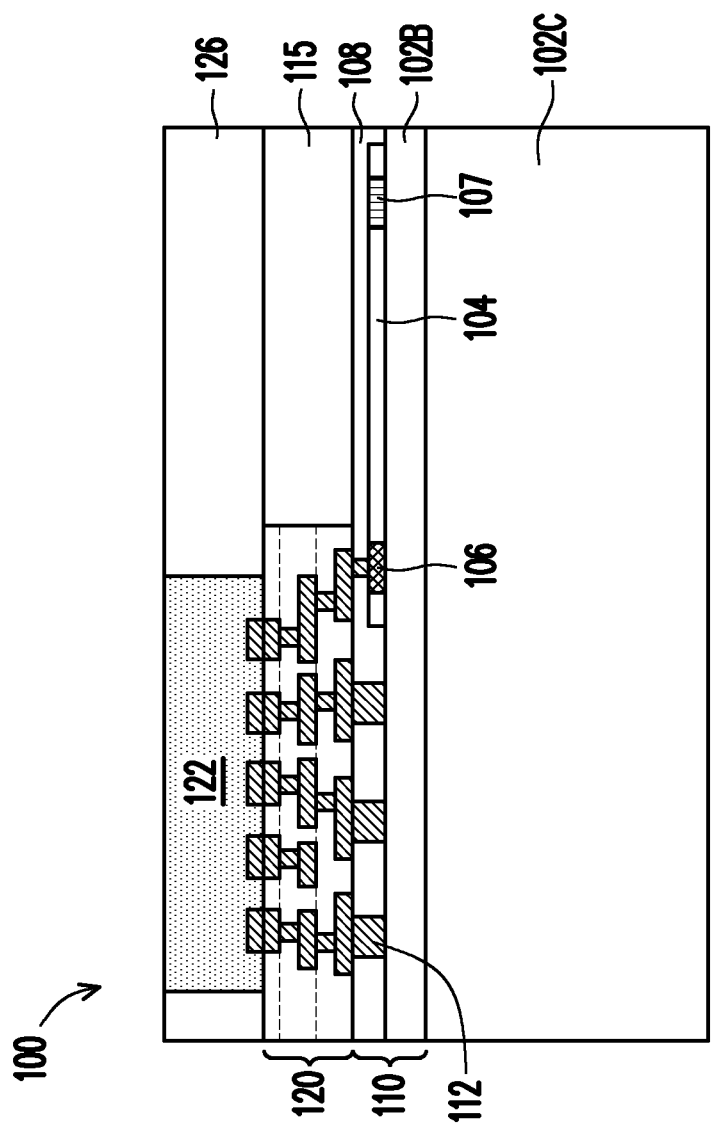

In FIG. 9, a dielectric material 126 is formed over the electronic dies 122 and the redistribution structure 120, in accordance with some embodiments. The dielectric material 126 may be formed of silicon oxide, silicon nitride, a polymer, the like, or a combination thereof. The dielectric material 126 may be formed by CVD, PVD, ALD, a spin-on-dielectric process, the like, or a combination thereof. In some embodiments, the dielectric material 126 may be formed by HDP-CVD, FCVD, the like, or a combination thereof. The dielectric material 126 may be a gap-fill material in some embodiments, which may include one or more of the example materials above. In some embodiments, the dielectric material 126 may be a material (e.g., silicon oxide) that is substantially transparent to light at wavelengths suitable for transmitting optical signals or optical power between the grating coupler 107 and a vertically-mounted optical fiber (see, e.g., 217B in FIG. 25A). In some embodiments in which a grating coupler 107 is not present, the dielectric material 126 may comprise a relatively opaque material such as an encapsulant, molding compound, or the like. Other dielectric materials formed by any acceptable process may be used. The dielectric material 126 may be planarized using a planarization process such as a CMP process, a grinding process, or the like. In some embodiments, the planarization process may expose the electronic dies 122 such that surfaces of the electronic dies 122 and surfaces of the dielectric material 126 are coplanar.

The use of dielectric-to-dielectric bonding may allow for materials transparent to the relevant wavelengths of light to be deposited over the redistribution structure 120 and/or around the electronic die 122 instead of opaque materials such as an encapsulant or a molding compound. For example, the dielectric material 126 may be formed from a suitably transparent material such as silicon oxide instead of an opaque material such as a molding compound. The use of a suitably transparent material for the dielectric material 126 in this manner allows optical signals to be transmitted through the dielectric material 126, such as transmitting optical signals between a grating coupler 107 and a vertically-mounted optical fiber (see, e.g., 217B in FIG. 25A) located above the dielectric material 126. Additionally, by bonding the electronic die 122 to the redistribution structure 120 in this manner, the thickness of the resulting photonic package 100 may be reduced, and the optical coupling between a grating coupler 107 and a vertically-mounted optical fiber may be improved. In some cases, this can reduce the size or processing cost of a photonic package, and the optical coupling to external components may be improved.

Figure 10:
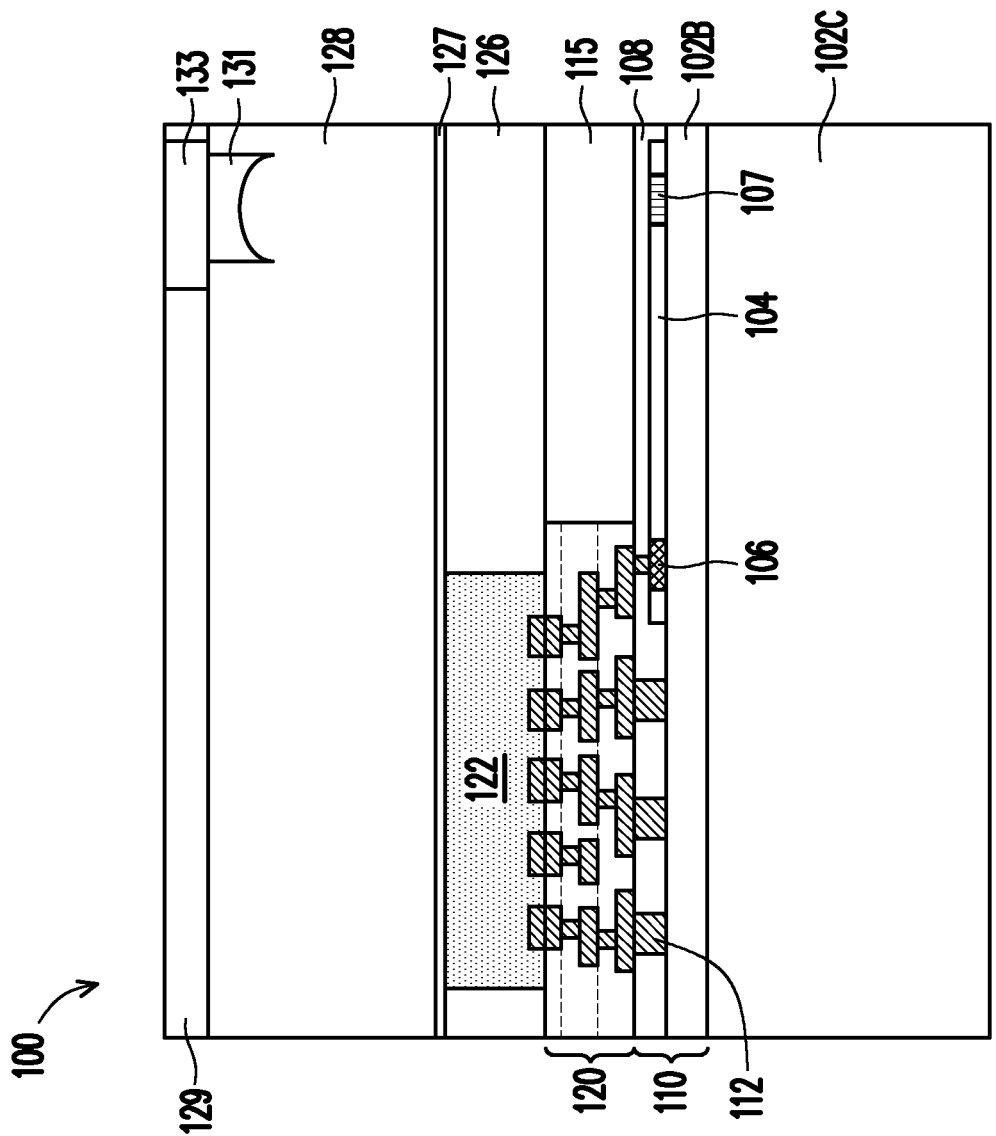

In FIG. 10, an optional support 128 is attached to the structure, in accordance with some embodiments. The support 128 is a rigid structure that is attached to the structure in order to provide structural or mechanical stability. The use of a support 128 can reduce warping or bending, which can improve the performance of the optical structures such as the waveguides 104 or photonic components 106. The support 128 may comprise one or more materials such as silicon (e.g., a silicon wafer, bulk silicon, or the like), a silicon oxide, a metal, an organic core material, the like, or another type of material. The support 128 may be attached to the structure (e.g., to the dielectric material 126 and/or the electronic dies 122) using an adhesive layer 127, as shown in FIG. 10, or the support 128 may be attached using direct bonding or another suitable technique. In some embodiments, the support 128 may have a thickness between about between about 500 μm and about 700 μm. The support 128 may also have lateral dimensions (e.g., length, width, and/or area) that are greater than, about the same as, or smaller than those of the structure. In other embodiments, the support 128 is attached at a later process step during the manufacturing the photonic package 100 than shown.

In the example of FIG. 10, a micro lens 131 is embedded in the support 128 at the upper surface of the support 128. In some embodiments, an etching process is performed to remove a portion of the support 128 to form a recess at the location of the micro lens 131, then a pre-formed micro lens 131 is placed into the recess in the support 128. In other embodiments, after the recess is formed in the support 128, the micro lens 131 is formed in-situ in the recess by depositing a suitable material in the recess. Next, a dielectric layer 129 is formed over the support 128, and an index matching material 133 is formed in the dielectric layer 129 over (e.g., directly over) the micro lens 131. The dielectric layer 129 may be formed of a suitable material, such as silicon oxide, silicon nitride, a polymer material, or the like, using a suitable deposition process. An etching process is then performed to remove a portion of the dielectric layer 129 to form a recess over the micro lens 131. The index matching material 133 is then deposited into the recess in the dielectric layer 129. A planarization process, such as CMP, may be performed to achieve a coplanar upper surface between the dielectric layer 129 and the index matching material 133. In some embodiments, the index matching material 133 is used to reduce light loss for light coming from or going into a vertically-mounted optical fiber (see, e.g., 217B in FIG. 25A), and has a refractive index of, e.g., about 1.4 to match the refractive index of silicon oxide. In some embodiments, the dielectric layer 129 and the index matching material 133 are omitted.

Figure 11:
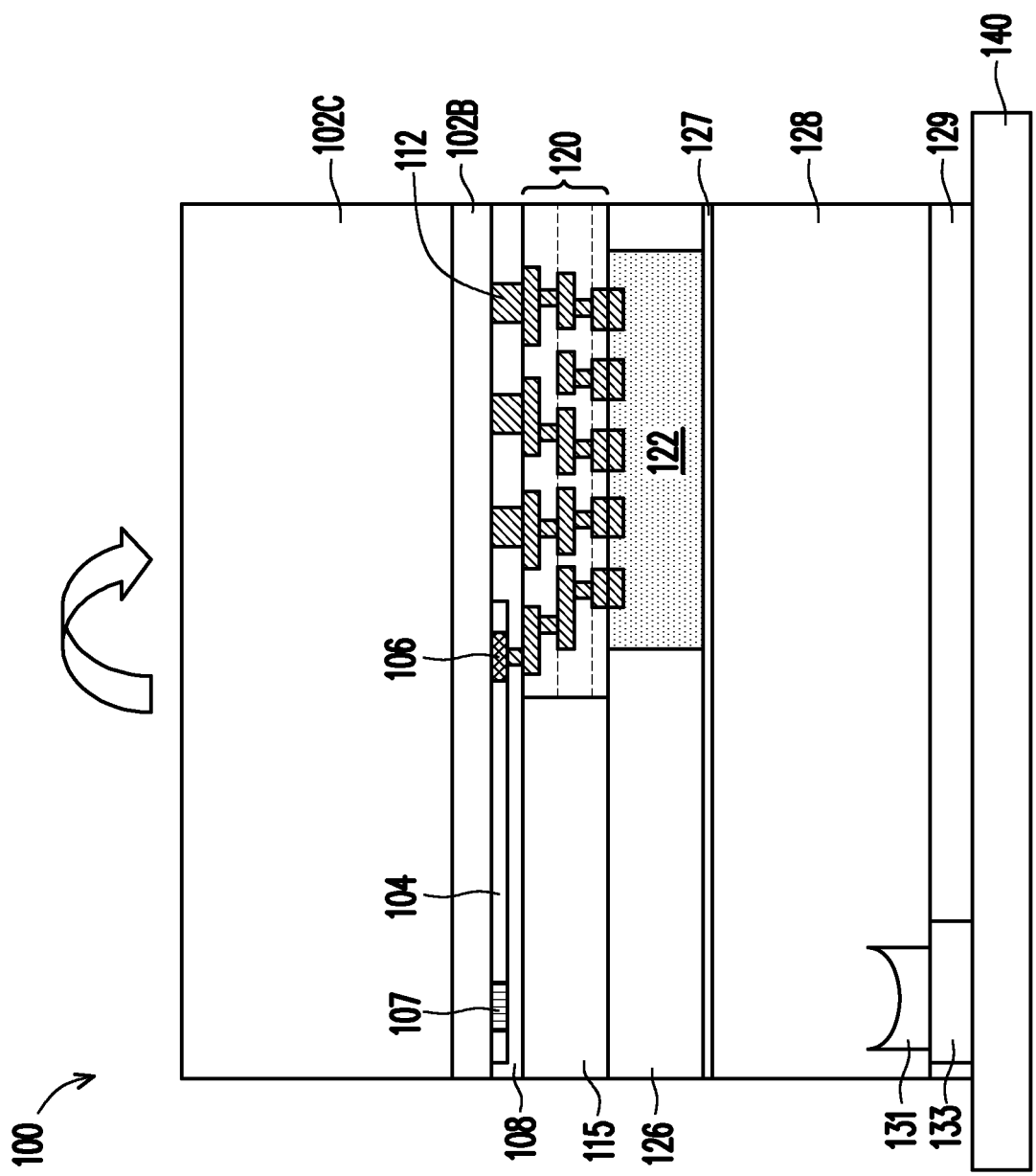

In FIG. 11, the structure in FIG. 10 is flipped over and attached to a carrier 140, in accordance with some embodiments. The carrier 140 may be, for example, a wafer (e.g., a silicon wafer), a panel, a glass substrate, a ceramic substrate, or the like. The structure may be attached to the carrier 140 using, for example, an adhesive or a release layer (not shown).

Figure 12:
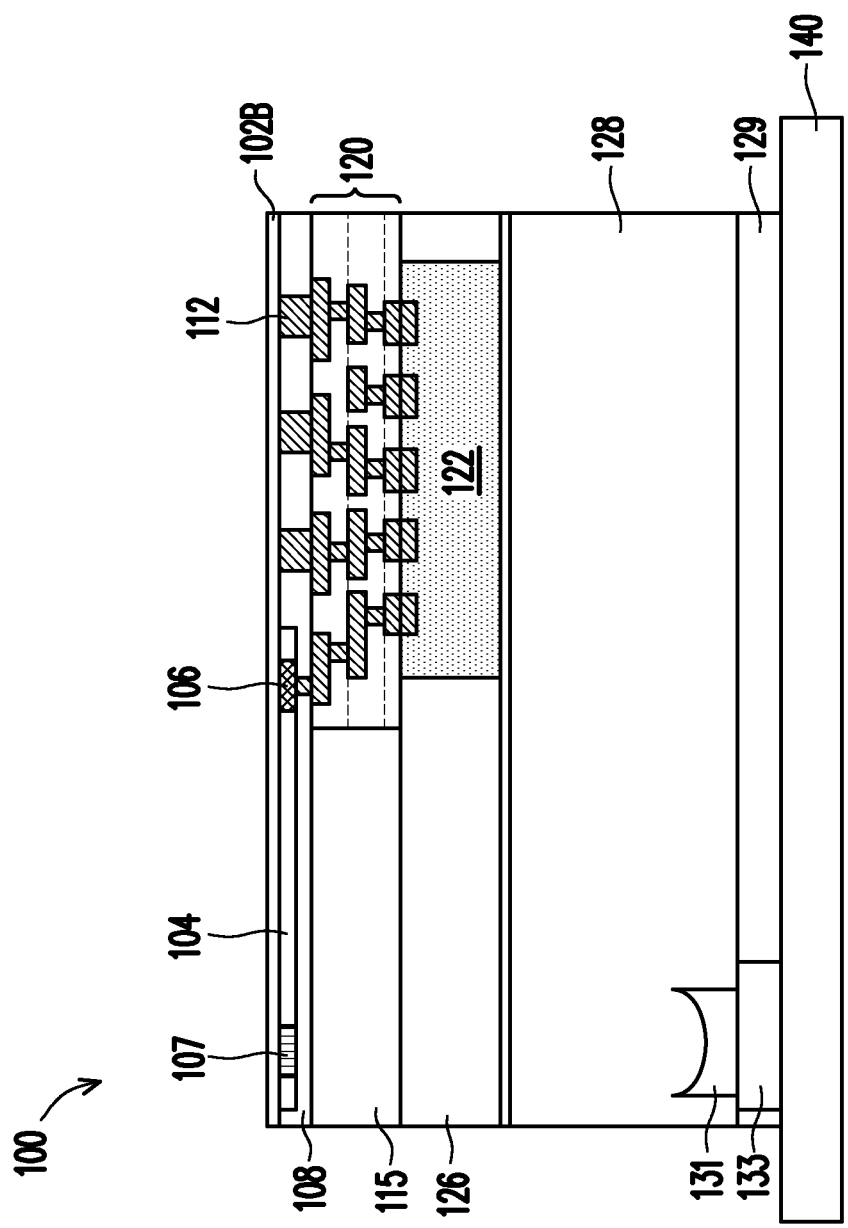

In FIG. 12, the substrate 102C is removed, in accordance with some embodiments. The substrate 102C may be removed using a planarization process (e.g., a CMP or grinding process), an etching process, a combination thereof, or the like. In some embodiments, the oxide layer 102B is also thinned. The oxide layer 102B may be thinned as part of the removal process for the substrate 102C, or the oxide layer 102B may be thinned in a separate step. The oxide layer 102B may be thinned, for example, using a planarization process, an etching process, a combination thereof, or the like. In some embodiments, after thinning, the oxide layer 102B may have a thickness in the range of about 0.1 µm to about 1.0 µm. Other thicknesses are possible. In some cases, thinning the oxide layer 102B may improve optical coupling between a waveguide 104 and a nitride waveguide 134 (see FIG. 14).

Figure 13:
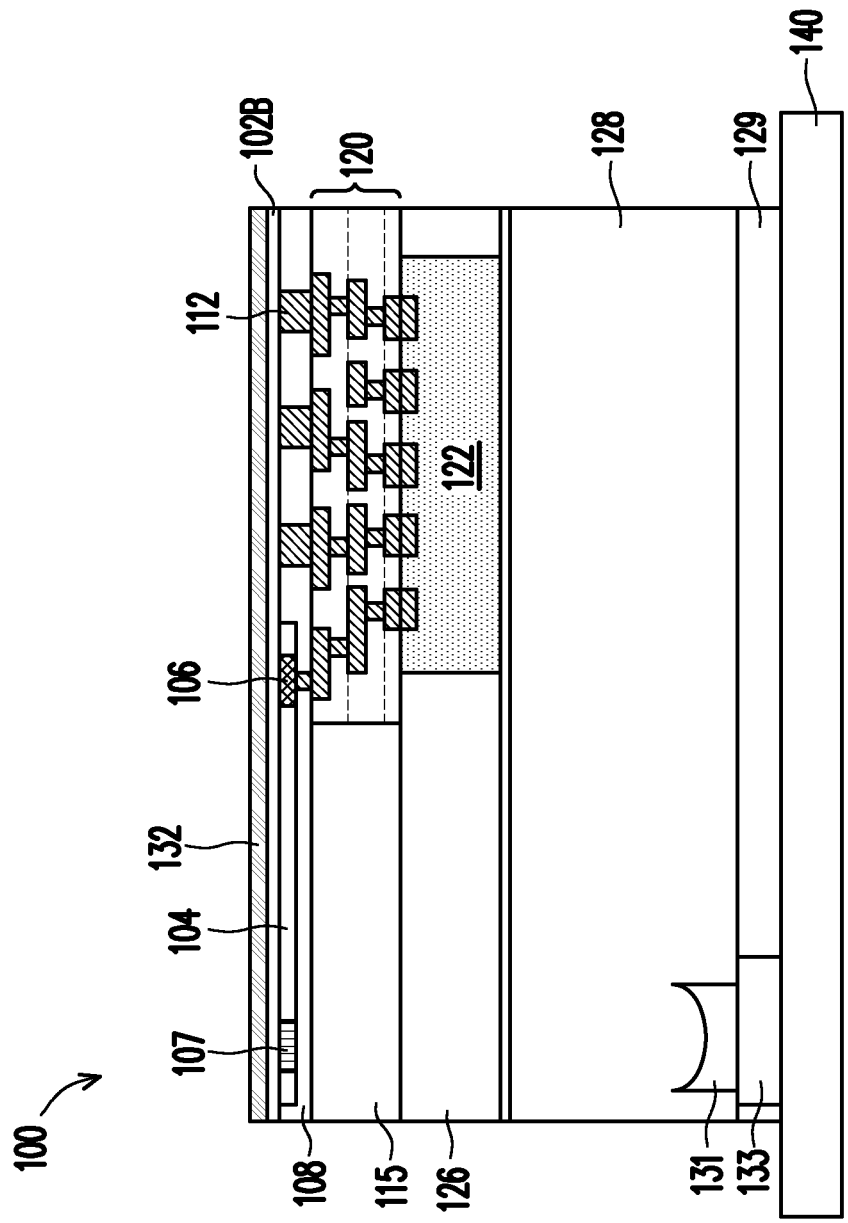
Figure 14:
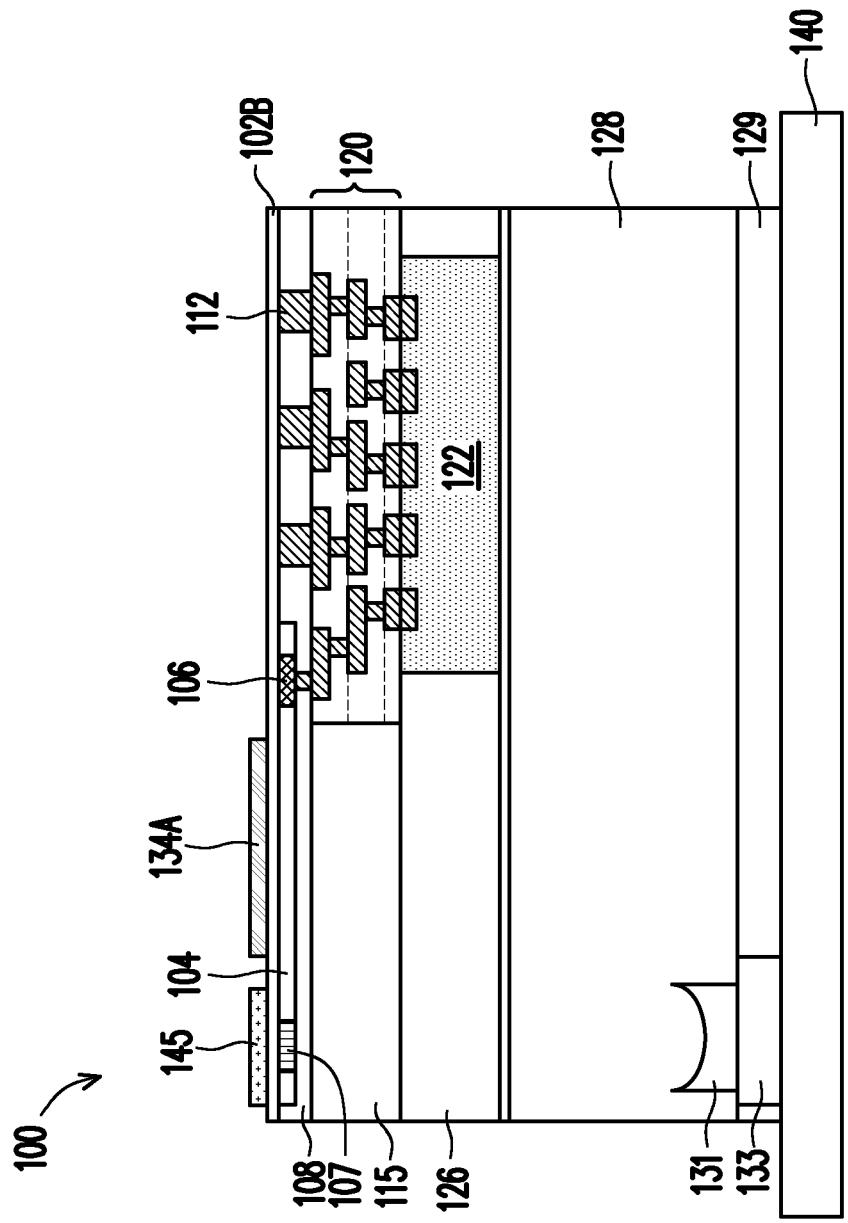

Turning to FIGS. 13 and 14, nitride waveguides 134A are formed over the oxide layer 102B, in accordance with some embodiments. In FIG. 13, a silicon nitride layer 132 is deposited on the oxide layer 102B. The silicon nitride layer 132 may be formed using a suitable deposition technique, such as CVD, PECVD, LPCVD, PVD, or the like. In some embodiments, the silicon nitride layer 132 is formed having a thickness in the range of about 0.2 µm to about 1.0 µm, though other thicknesses are possible.

In FIG. 14, the silicon nitride layer 132 is patterned to form the nitride waveguides 134A, in accordance with some embodiments. For easy of discussion, the nitride waveguides 134A and the subsequently formed nitride waveguides 134B 134C, and 134D (see, e.g., FIG. 16) are collectively referred to as nitride waveguides 134. The nitride waveguide 134 may be patterned using acceptable photolithography and etching techniques. For example, a hardmask layer may be formed over the silicon nitride layer 132 and patterned, in some embodiments. The pattern of the hardmask layer may then be transferred to the silicon nitride layer 132 using an etching process. The etching process may include, for example, a dry etching process and/or a wet etching process. The etching process may be selective to silicon nitride over silicon oxide or other materials. The silicon nitride layer 132 may be etched to form recesses defining the nitride waveguides 134, with sidewalls of the remaining unrecessed portions defining sidewalls of the nitride waveguides 134. In some embodiments, more than one photolithography and etching sequence may be used in order to pattern the silicon nitride layer 132. One nitride waveguide 134 or multiple nitride waveguides 134 may be patterned from the silicon nitride layer 132. If multiple nitride waveguides 134 are formed, the multiple nitride waveguides 134 may be individual separate nitride waveguides 134 or connected as a single continuous structure. In some embodiments, one or more of the nitride waveguides 134 form a continuous loop. In some embodiments, nitride waveguides 134 may include photonic structures such as grating couplers, edge couplers, or couplers (e.g., mode converters) that allow optical signals to be transmitted between two nitride waveguides 134 and/or between a nitride waveguide 134 and a waveguide 104.

In some cases, a waveguide formed from silicon nitride (e.g., nitride waveguides 134) may have advantages over a waveguide formed from silicon (e.g., waveguides 104). For example, silicon nitride has a higher dielectric constant than silicon, and thus a nitride waveguide may have a greater internal confinement of light than a silicon waveguide. This may also allow the performance or leakage of nitride waveguides to be less sensitive to process variations, less sensitive to dimensional uniformity, and less sensitive to surface roughness (e.g., edge roughness or linewidth roughness). In some cases, the reduced process sensitivity may allow nitride waveguides to be easier or less costly to process than silicon waveguides. These characteristics may allow a nitride waveguide to have a lower propagation loss than a silicon waveguide. In some cases, the propagation loss (dB/cm) of a nitride waveguide may be between about 0.1% and about 50% of a silicon waveguide. In some cases, a nitride waveguide may also be less sensitive to the temperature of the environment than a silicon waveguide. For example, a nitride waveguide may have a sensitivity to temperature that is as small as about 1% of that of a silicon waveguide. In this manner, the embodiments described herein can allow for the formation of a photonic package that has both nitride waveguides (e.g., nitride waveguides 134) and silicon waveguides (e.g., waveguides 104).

Still referring to FIG. 14, a reflector 145 is formed on the oxide layer 102B over the grating coupler 107. The reflector 145 can be configured to reflect the light from a photonic component such as, e.g., a vertically mounted optical fiber 217B, and can allow for more efficient coupling between a grating coupler 107 and the photonic component. The reflector 145 may be formed from one or more dielectric materials, metal materials, or the like, which may be deposited using suitable deposition processes. After depositing the material of the reflector 145, the reflector 145 may be formed using suitable techniques, such as using photolithographic patterning and etching techniques. Other techniques of forming a reflector 145 are possible.

Figure 15:
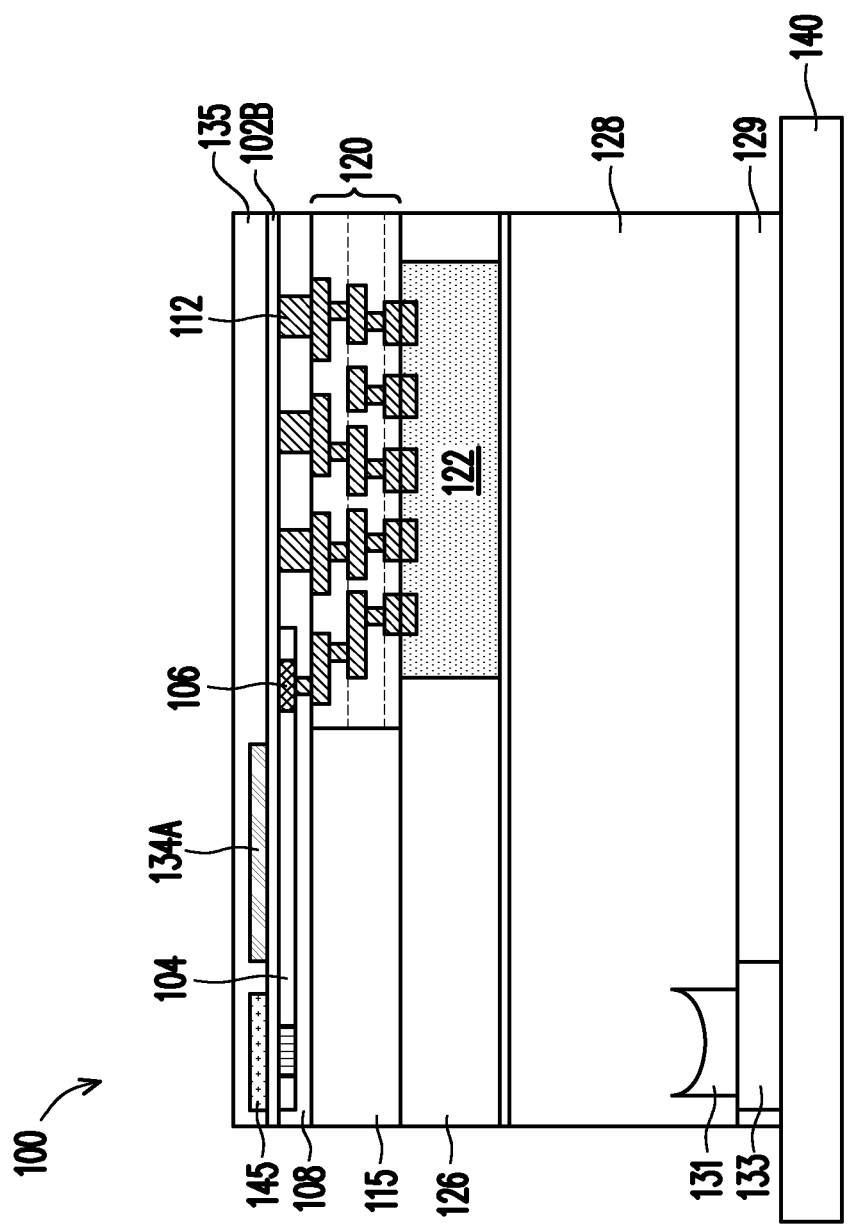

Turning to FIG. 15, a dielectric layer 135 is formed over the nitride waveguides 134, in accordance with some embodiments. The dielectric layer 135 may comprise one or more materials similar to those described above for the dielectric layer 108 or the dielectric layer 115. For example, the dielectric layer 135 may comprise a silicon oxide, spin-on glass, or the like. The dielectric layer 135 may be formed using a technique similar to those described above for the dielectric layer 108 or the dielectric layer 115, or may be formed using a different technique. For example, the dielectric layer 135 may be formed using CVD, PVD, spin-on, or the like, though another technique may be used. In some embodiments, a planarization process (e.g., a CMP or grinding process) is used to remove excess material of the dielectric layer 135. After planarization, the dielectric layer 135 may have a thickness between about 0.5 µm and about 2 µm, in some embodiments. Other thicknesses are possible.

Figure 16:
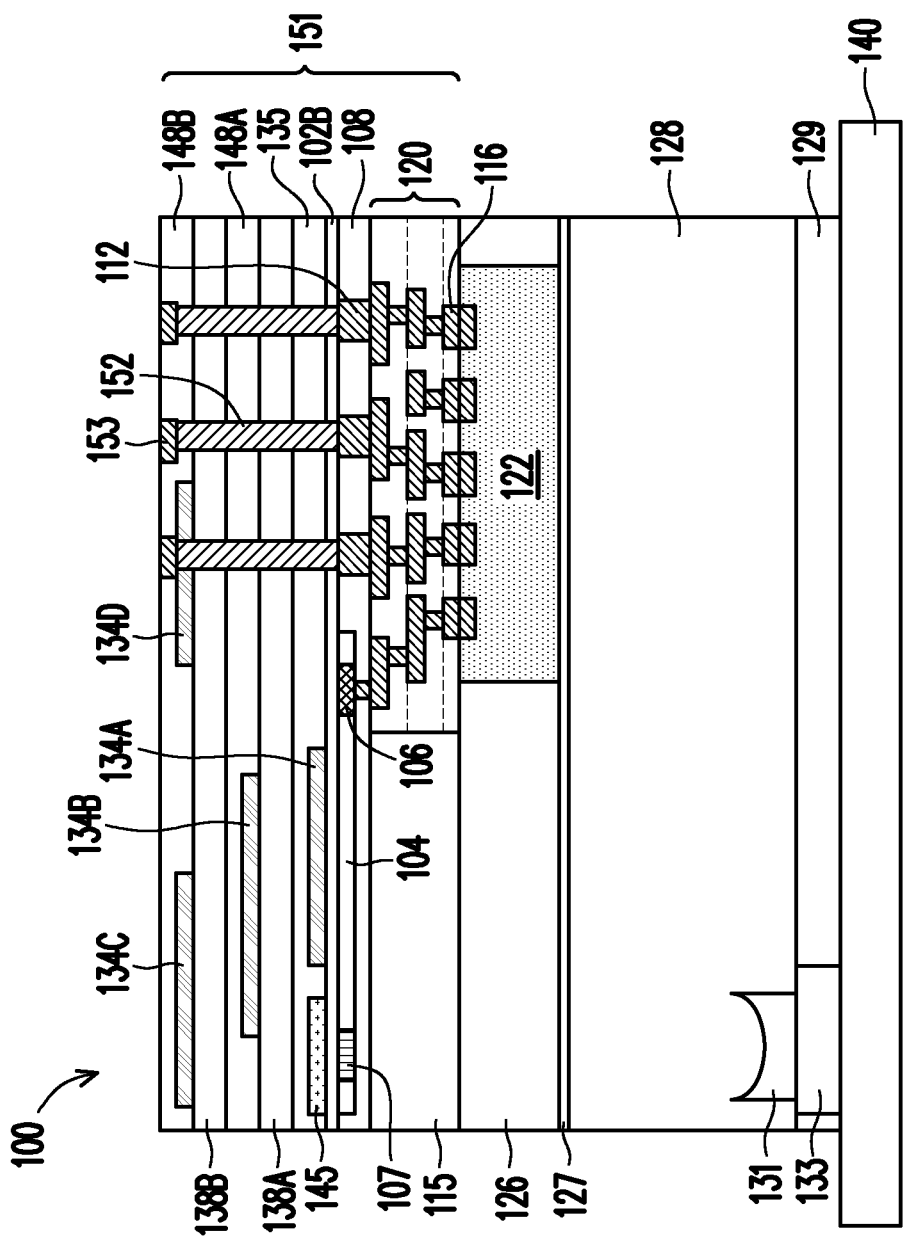

Next, in FIG. 16, a dielectric layer 138A is formed over the dielectric layer 135, a nitride waveguide 134B is formed over the dielectric layer 138A, and a dielectric layer 148A is then formed over the nitride waveguide 134B and the dielectric layer 138A. The dielectric layers 138A/148A and the nitride waveguide 134B may be formed of a same or similar material using a same or similar formation method as the dielectric layer 135 and the nitride waveguide 134A, respectively, thus details are not repeated. The same processing can be repeated to form additional dielectric layers (e.g., 138B, 148B) and additional nitride waveguides (e.g., 134C, 134D). The number of nitride waveguides and the number of dielectric layers over the dielectric layer 135 shown in FIG. 16 is merely a non-limiting example. Other numbers are also possible and are fully intended to be included within the scope of the present disclosure.

Next, vias 152 are formed to extend through the dielectric layers (e.g., 102B, 135, 138A, 148A, 138B, and 148B) and connect with vias 112. Conductive pads 153 are formed in the dielectric layer 148B over respective vias 152. The vias 152 and the conductive pads 153 may be formed by the same or similar formation methods as the vias 112 and the conductive pads 116, respectively, thus details are not repeated here. Although one photonic package 100 is shown in FIG. 16, skilled artisan will appreciate that tens, hundreds, or more identical photonic packages may be formed over the carrier 140 at the same. In some embodiments, a singulation process is performed to separate the multiple photonic packages into individual photonic packages 100.

Figure 17:
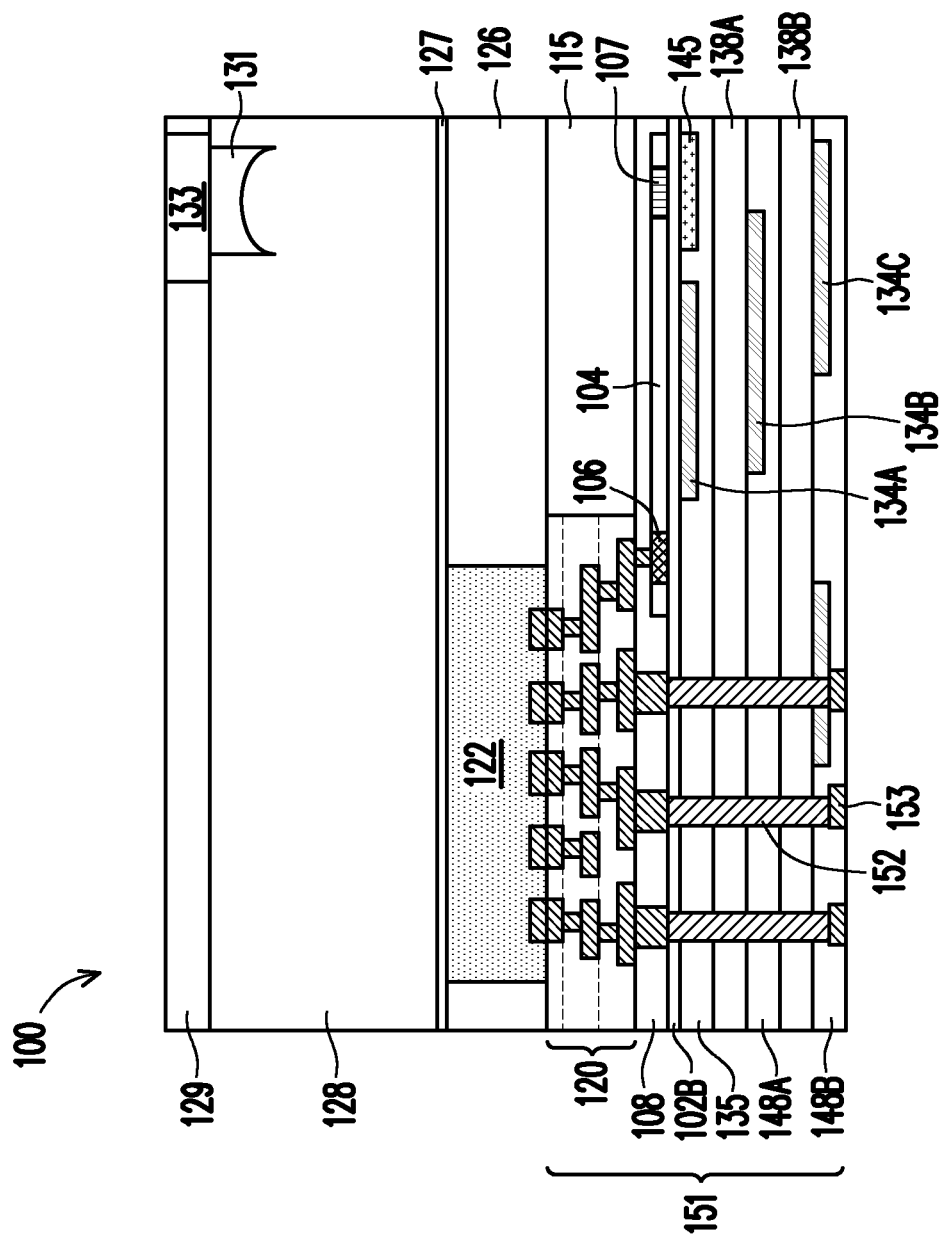

FIG. 17 shows the photonic package 100 after the carrier 140 is removed. In the example of FIG. 17, the structure below the electronic die 122 is referred to as a photonic die 151, which includes the redistribution structure 120, the dielectric layers 115, 108, 102B, 135, 138A, 138B, 148A, and 148B, and components formed in the dielectric layers, such as the waveguide 104, the photonic component 106, the grating coupler 107, the reflector 145, and the nitride waveguides 134 (e.g., 134A, 134B, 134C, and 134D). Therefore, the photonic package 100 includes an electronic die 122 bonded to a photonic die 151, and optionally, may include support 128, the micro lens 131, the dielectric layer 129 and the index matching material 133.

Note that in FIG. 17, the waveguides (e.g., 104, 134A, 134B, and 134C) in adjacent (e.g., immediately adjacent) dielectric layers overlap laterally. For example, in FIG. 17, the nitride waveguides 134A is within lateral extents of the waveguide 104, at least a portion of the nitride waveguides 134A is within lateral extents of the nitride waveguide 134B, and at least a portion of the nitride waveguides 134B is within lateral extents of the nitride waveguide 134C. Since optical coupling may happen between waveguides placed in close proximity, by forming the waveguides to be overlapping laterally, an "optical through-via" (see, e.g., 160 in FIG. 25B) may be formed by these waveguides (e.g., 104, 134A, 134B, 134C), which allows optical signals to be transmitted (e.g., relayed) in the vertical direction of FIG. 17 through the optical coupling between adjacent waveguides. Details of the optical through-via are discussed below.

Figure 18:
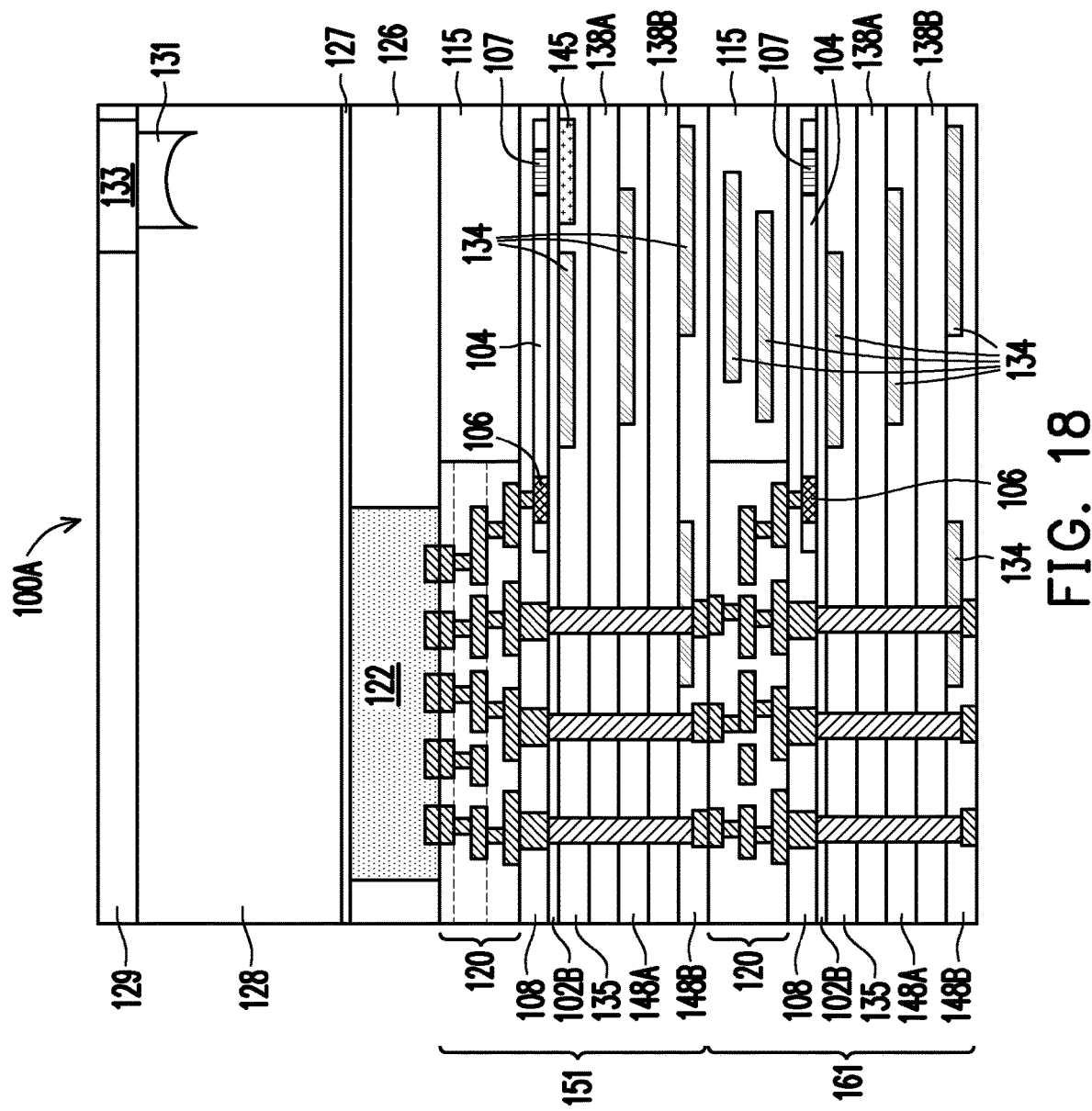
FIG. 18 illustrates a cross-sectional view of a photonic package, in accordance with another embodiment.

FIG. 18 illustrates a cross-sectional view of a photonic package 100A, in accordance with another embodiment. The photonic package 100A is similar to the photonic package 100 of FIG. 17, but with a photonic die 161 bonded to the photonic die 151. As illustrated in FIG. 18, the photonic die 161 is similar to the photonic die 151, but with additional nitride waveguides 134 formed in the dielectric layer 115 of the photonic die 161. In some embodiments, the vertical distance between the waveguide 104 of the photonic die 161 and the lowermost nitride waveguide 134 of the photonic die 151 may be too large to allow for optical coupling, and therefore, the nitride waveguides 134 in the dielectric layer 115 of the photonic die 161 are formed as intermediate optical medium to break up the large vertical distance to allow optical coupling between the photonic dies 151 and 161. Although two photonic dies are shown in FIG. 18, the number of photonic dies in the photonic package 100A may be any suitable number. These and other variations are fully intended to be included within the scope of the present disclosure.

Int the discussion below, the photonic package 100 in FIG. 17 is used in various embodiments to form semiconductor packages. One skilled in the art will readily appreciate that variations of the photonic package 100, such as the photonic package 100A, may replace the photonic package 100 in the various embodiments to form semiconductor packages. These and other variations are fully intended to be included within the scope of the present disclosure.

FIGS. 19 through 22 illustrate cross-sectional views of an interposer 50 having a waveguide at various stages of manufacturing, in accordance with an embodiment. In various embodiments disclosed hereinafter, the photonic package described above (e.g., 100, or 100A) is bonded to the interposer 50 (or its variations) to form various semiconductor packages.

Figure 19:
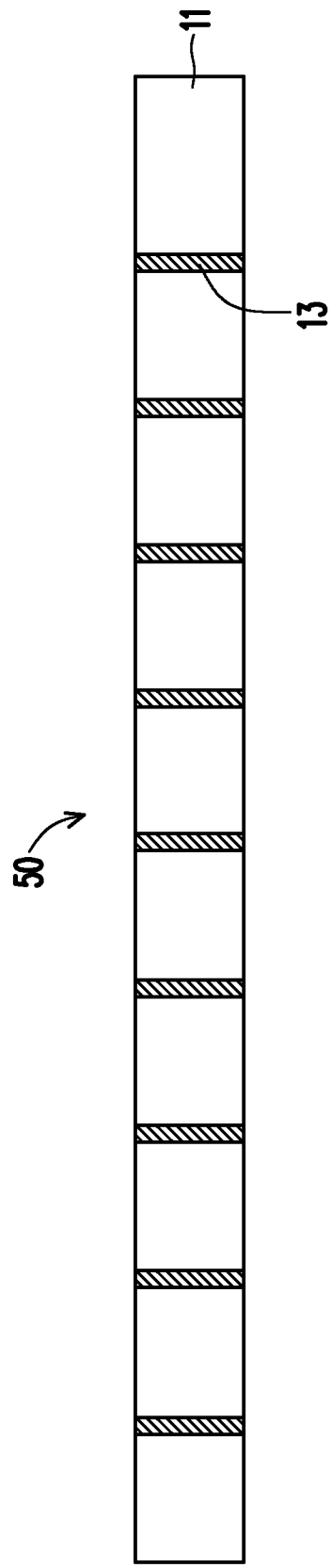
FIGS. 19 through 22 illustrate cross-sectional views of an interposer with a waveguide at various stages of manufacturing, in accordance with an embodiment.

FIG. 19 shows a substrate 11 with through substrate vias (TSVs) 13. The substrate 11 may be, e.g., a silicon substrate, doped or undoped, or an active layer of a silicon-on-insulator (SOI) substrate. However, the substrate 11 may alternatively be a glass substrate, a ceramic substrate, a polymer substrate, or any other substrate that may provide a suitable protection and/or interconnection functionality. These and any other suitable materials may alternatively be used for the substrate 11.

The TSVs 13 may be formed by etching the substrate 11 to generate TSV openings and filling the TSV openings with conductive material(s), such as a liner (not separately illustrated in FIG. 19), a barrier layer (also not separately illustrated in FIG. 19), and a conductive material. In an embodiment the liner may be a dielectric material such as silicon nitride, silicon oxide, a dielectric polymer, combinations of these, or the like, formed by a process such as chemical vapor deposition, oxidation, physical vapor deposition, ALD, or the like. The barrier layer may be an electrically conductive material such as titanium nitride, tantalum nitride, titanium, tantalum, or the like, formed using a CVD process (e.g., PECVD), sputtering, metal organic chemical vapor deposition (MOCVD), ALD, or the like. The conductive material may comprise copper, although other suitable materials such as aluminum, tungsten, alloys, doped polysilicon, combinations thereof, or the like, may also be utilized. The conductive material may be formed by depositing a seed layer and then electroplating copper onto the seed layer, filling and overfilling the TSV openings. Once the TSV openings have been filled, excess liner/barrier layer and excess conductive material outside of the TSV openings may be removed through a grinding process such as chemical mechanical polishing (CMP), although any suitable removal process may be used.

Figure 20:
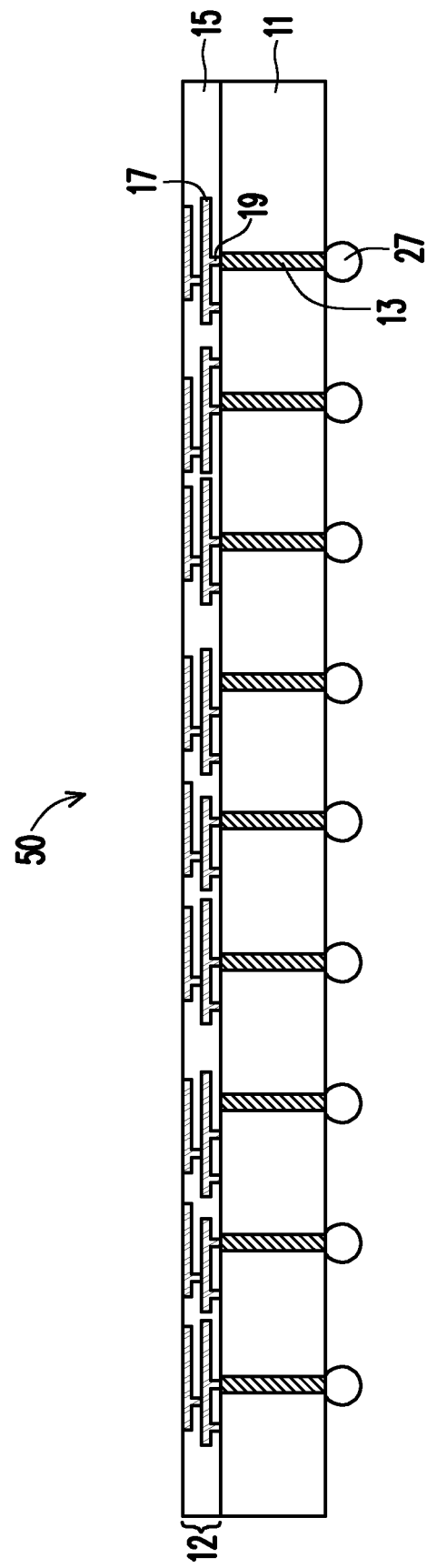

Next, in FIG. 20, a redistribution structure 12 is formed over the substrate 11. The redistribution structure 12 includes one or more dielectric layers 15 (e.g., silicon oxide layers), and conductive features such as conductive lines 17 and vias 19. The redistribution structure 12 may be formed in a same or similar formation process using the same or similar materials as the redistribution structure 120 of the photonic package 100, thus details are not repeated.

Figure 21:
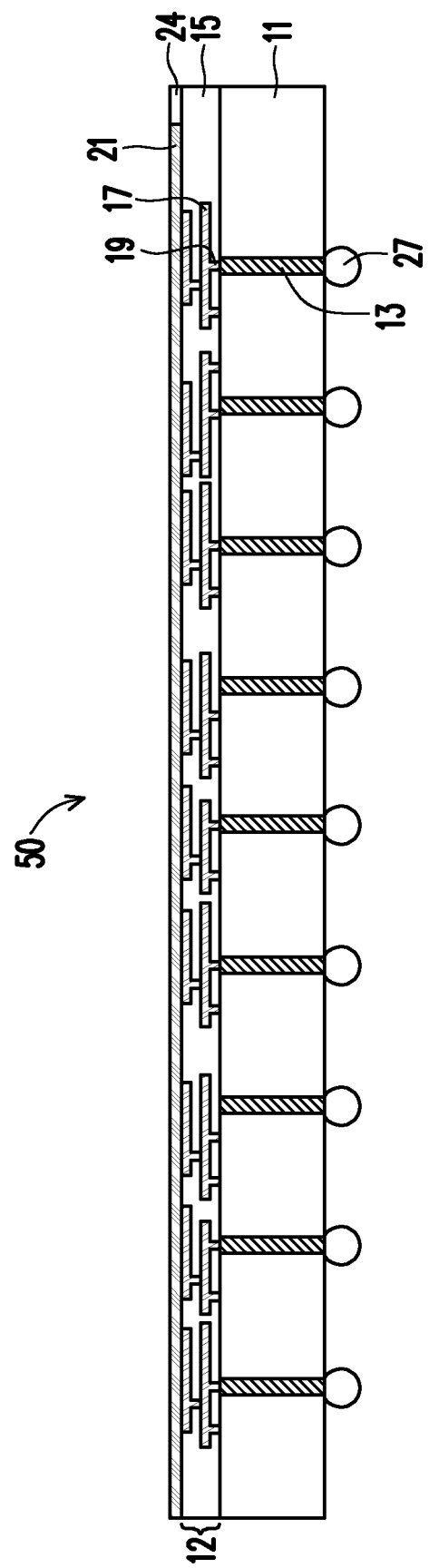

Next, in FIG. 21, a nitride waveguide 21 is formed over the redistribution structure 12. The nitride waveguide 21 is formed by forming a silicon nitride layer over the redistribution structure 12 and patterning the silicon nitride layer. Details are the same as or similar to those for forming the nitride waveguides 134 of the photonic package 100, thus are not repeated. The nitride waveguide 21 may include photonic structures such as an edge coupler 24, which allows optical signals and/or optical power to be transferred between the nitride waveguide 21 and a photonic component that is horizontally mounted near a sidewall of the interposer 50, such as an edge-mounted optical fiber (see, e.g., 217A in FIG. 25A).

Figure 22:
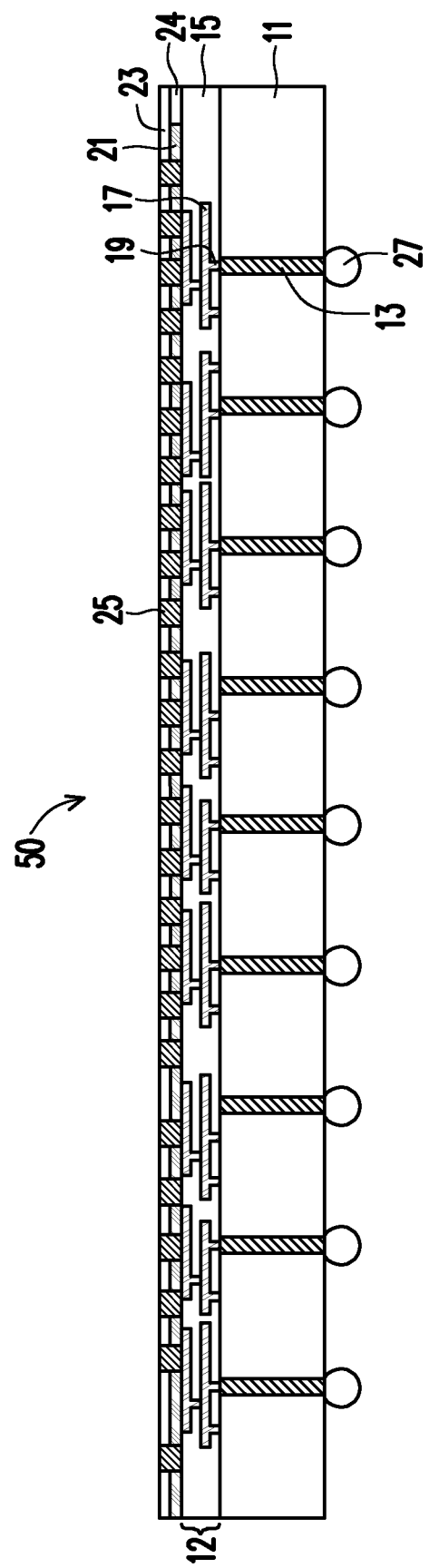

Next, in FIG. 22, a dielectric layer 23 is formed over the nitride waveguide 21 and over the redistribution structure 12, and conductive pads 25 are formed to extend through the dielectric layer 23 to connect with the conductive features of the redistribution structure 12. The dielectric layer 23 may be formed of a same or similar material (e.g., silicon oxide) as the dielectric layer 15. In some embodiments, the refractive index of the dielectric layers 23 and 15 are smaller than the refractive index of the nitride waveguide 21 to ensure that the nitride waveguide 21 has high internal reflections such that light is substantially confined within the nitride waveguide 21. The conductive pads 25 may be formed by a same or similar formation method as the conductive pads 153 of the photonic package 100, thus details are not repeated. Conductive connectors 27, also referred to as external connectors, are formed on the lower surface of the interposer 50 to connect with the TSVs 13. The conductive connectors 27 may be, e.g., ball grid array (BGA) connectors, solder balls, metal pillars, controlled collapse chip connection (C4) bumps, micro bumps, electroless nickel-electroless palladium-immersion gold technique (ENEPIG) formed bumps, or the like.

Figure 23:
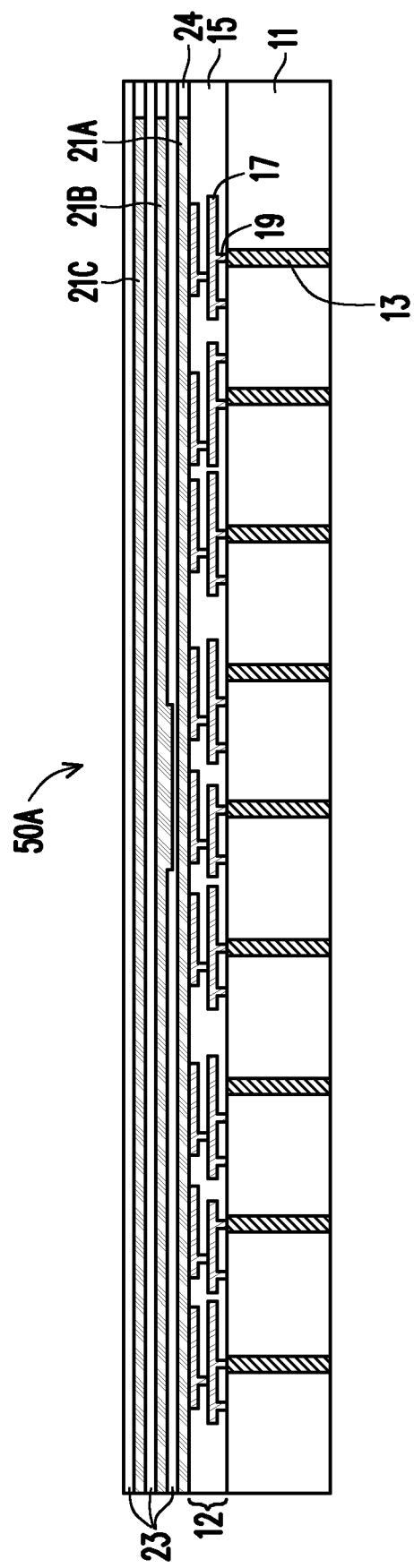
FIG. 23 illustrates a cross-sectional view of an interposer with multiple layers of waveguides, in accordance with an embodiment.

FIG. 23 illustrates a cross-sectional view of an interposer 50A with multiple layers of waveguides, in accordance with an embodiment. The interposer 50A is similar to the interposer 50 of FIG. 22, but has multiple layers of nitride waveguides, such as nitride waveguides 21A, 21B, and 21C, formed over the redistribution structure 12. Each of the nitride waveguides 21A, 21B, and 21C may have a different thickness measured along the vertical direction of FIG. 23. The nitride waveguides 21A, 21B, and 21C with different thicknesses may serve different functions in the photonic package formed. In addition, at least one of the nitride waveguides, e.g., the nitride waveguide 24B, is formed to have different thicknesses in different portions. For example, the middle portion of the nitride waveguide 21B in FIG. 23 is thicker than other portions of the nitride waveguide 21B. In some embodiments, the same nitride waveguide 21 (e.g., 21A, 21B, or 21C) may have thicknesses of, e.g., 800 nm, 300 nm, and 150 nm at different portions of the nitride waveguide.

Figure 24:
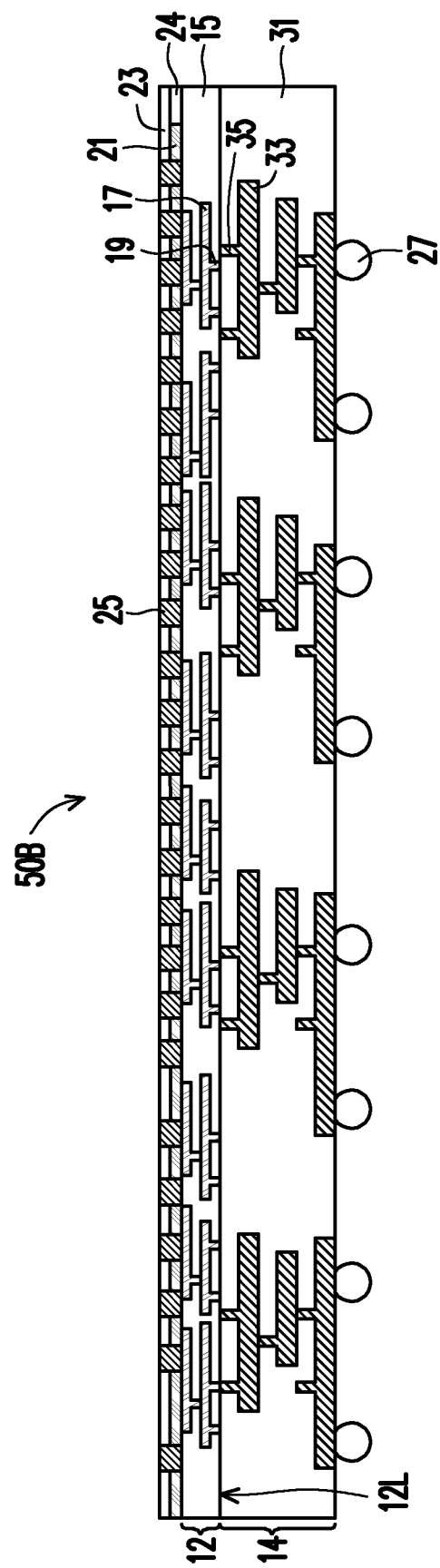
FIG. 24 illustrates a cross-sectional view of an interposer with a waveguide and an organic substrate, in accordance with an embodiment.

FIG. 24 illustrates a cross-sectional view of an interposer 50B with a waveguide and an organic substrate, in accordance with an embodiment. The interposer 50B is similar to the interposer 50 of FIG. 22, but with the substrate 11 and the TSVs 13 replaced with a redistribution structure 14 that includes one or more layers of an organic material 31 and conductive features (e.g., conductive lines 33 and vias 35) in the organic material 31. The interposer 50B may be formed by: forming a structure similar to the interposer 50 of FIG. 22 but without the TSVs 13 and the conductive connectors 27, removing the substrate 11, then forming the redistribution structure 14 at the lower side 12L of the redistribution structure 12.

To form the redistribution structure 14, a layer of the organic material 31, such as a polymer material (e.g., polyimide) or the like, is formed on the lower side 12L of the redistribution structure 12. Openings are then formed in the layer of the organic material 31 to expose the conductive features of the redistribution structure 12. A seed layer is formed over the layer of the organic material 31 and into the openings. A patterned photoresist layer is then formed on the seed layer, where the patterns (e.g., openings) of the patterned photoresist layer correspond to locations of the conductive lines 33 and the vias 35. A conductive material (e.g., copper or the like) is then formed in the patterns of the patterned photoresist layer, e.g., through a plating process.

The photoresist layer is then removed (e.g., by an ashing process), and portions of the seed layer on which no conductive material is formed are removed by an etching process. The process can be repeated to form additional layers of the organic material 31 and additional layers of conductive features for the redistribution structure 14.

Note that due to the processes available for the deposition, patterning, and curing of the organic material 31 (which may be softer than dielectric materials such as oxide and nitride, and may have a different thermal budget), the dimension of the conductive features 33/35 of the redistribution structure 14 are different from those of the conductive features 17/19 of the redistribution structure 12. For example, the smallest dimension of the conductive features, such as the line width and/or the line pitch (e.g., distance between adjacent conductive lines) of the conductive lines 33 are larger than those of the conductive lines 17. Although the redistribution structure 14 may provide less routing density than the redistribution structure 12, using the organic material 31 does provide certain advantages. The advantages of using the organic material 31 include lower material cost and easiness to cover the whole wafer surface during manufacturing. Another advantage is the option to embed local silicon interconnect (LSI) chips in the organic material 31, which allows for greater die-to-die routing capacity. Example of interposer with embedded LSI chips are described below with reference to FIGS. 31-33.

In the discussion below, the photonic package 100 is bonded to the interposer 50 to form semiconductor packages in various embodiments. One skilled in the art will readily appreciate that variations of the interposer 50, such as the interpose 50A or the interposer 50B, may replace the interposer 50 in the various embodiments to form semiconductor packages. These and other variations are fully intended to be included within the scope of the present disclosure.

FIGS. 25A-25D illustrate various views (e.g., cross-sectional view, plan view) of a semiconductor package 500, in accordance with an embodiment. To form the semiconductor package 500, the photonic package 100 is bonded to the interposer 50 by dielectric-to-dielectric bonding and/or metal-to-metal bonding (e.g., direct bonding, fusion bonding, oxide-to-oxide bonding, hybrid bonding, or the like). In such embodiments, covalent bonds may be formed between oxide layers, such as the dielectric layer 23 of the interposer 50 and the dielectric layers 148B of the photonic package 100. During the bonding, metal bonding may also occur between the conductive pads 153 of the photonic package 100 and the conductive pads 25 of the interposer 50.

Figure 25A:
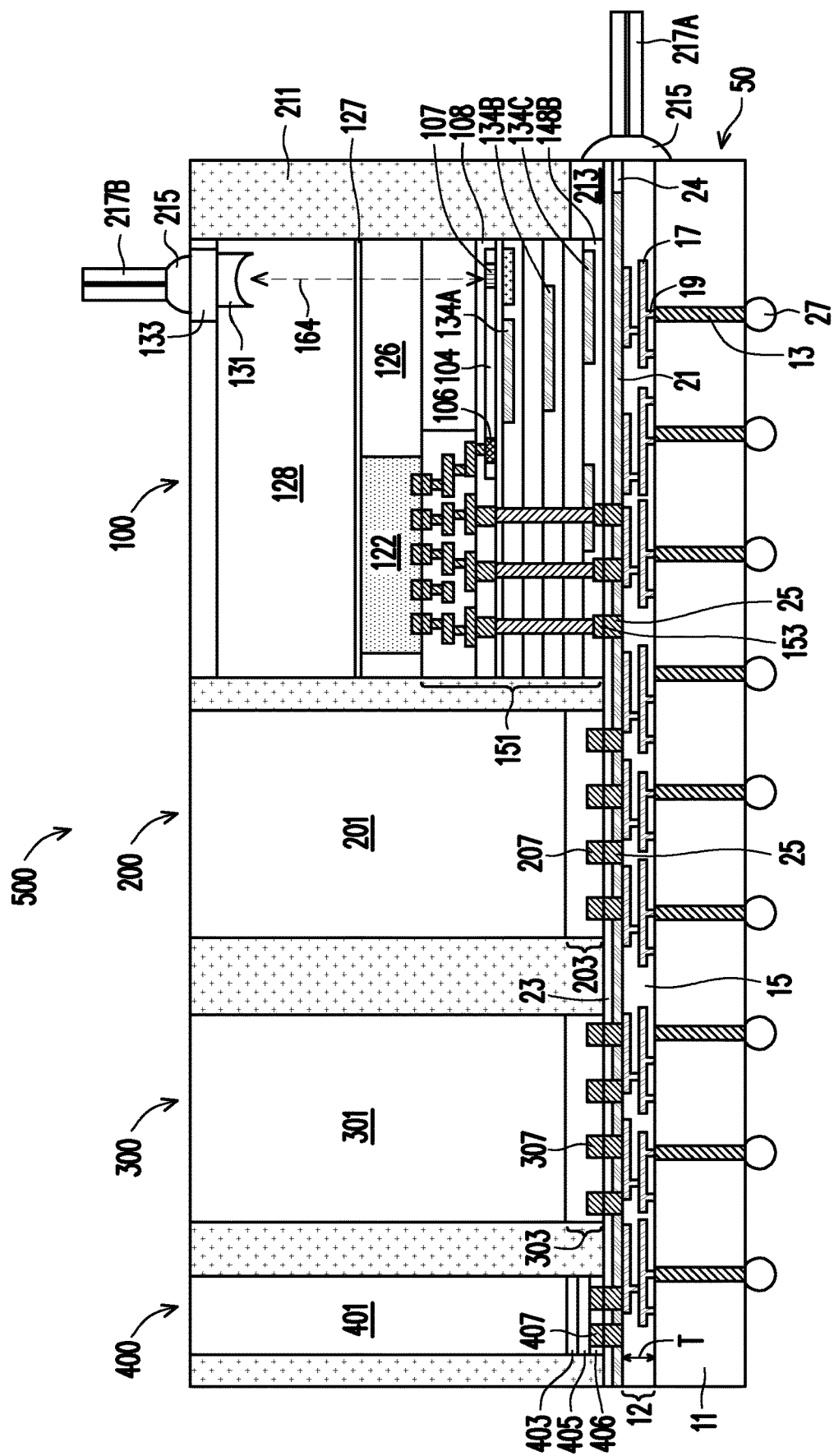
FIGS. 25A-25D illustrate various views (e.g., cross-sectional view, plan view) of a semiconductor package, in accordance with an embodiment.

As illustrated in FIG. 25A, besides the photonic package 100, semiconductor devices 200 and 300, as well as a laser diode 400, are bonded to the interposer 50. In some embodiments, the semiconductor device 200 comprises, e.g., a processing die, a central processing unit (CPU), a graphics processing unit (GPU), an application-specific integrated circuit (ASIC), a high performance computing (HPC) die, the like, or a combination thereof. FIG. 25A shows the substrate 201 of the semiconductor device 200, which has electric components such as transistors, resistors, capacitors, inductors, or the like formed thereon, and an interconnect structure 203 of the semiconductor device 200, which includes conductive features formed in a plurality of dielectric layers to interconnect the electric components to form functional circuits of the semiconductor device 200. Conductive pads 207 of the semiconductor device 200 are bonded to the conductive pads 25 of the interposer 50.

In some embodiments, the semiconductor device 300 comprises, e.g., a memory die, a high-bandwidth memory (HBM) device, a volatile memory such as dynamic random-access memory (DRAM), static random-access memory (SRAM), another type of memory, or the like. FIG. 25A shows the substrate 301 of the semiconductor device 300, which has memory cells and other electrical components formed thereon, and an interconnect structure 303 which includes conductive features formed in a plurality of dielectric layers to interconnect the electrical components to form functional circuits of the semiconductor device 300. Conductive pads 307 of the semiconductor device 300 are bonded to the conductive pads 25 of the interposer 50.

FIG. 25A further illustrates a substrate 401, a light emitting layer 403, a contact layer 405 (e.g., a doped semiconductor layer), and a dielectric layer 406 (e.g., silicon oxide) of the laser diode 400. The contact layer 405 and the dielectric layer 406 may be transparent or nearly transparent to light within the range of wavelengths of the laser diode 400, so that the nitride waveguide 21 of the interposer 50 is optically coupled to the light emitting layer 403 of the laser diode 400. Conductive pads 407 of the laser diode are bonded to the conductive pads 25 of the interposer 50. In some embodiments, the laser diode 400 generates light signals (e.g., laser signals) under the control of, e.g., the semiconductor device 200, and sends the light signals to the photonic package 100 through the nitride waveguide 21 of the interposer 50. Laser diode 400 is used as a non-limiting example, other III-V devices may also be used in the photonic package 100, as skilled artisans readily appreciate.

In FIG. 25A, a molding material 211 is formed over the interposer 50 around the photonic package 100, the semiconductor devices 200 and 300, and the laser diode 400. The molding material 211 may be cured by a curing process. After the molding material 211 is formed, a planarization process, such as CMP, is performed to achieve a coplanar upper surface between the photonic package 100, the semiconductor devices 200 and 300, and the laser diode 400.

Still referring to FIG. 25A, the photonic package 100 is shown as coupled to a vertically-mounted optical fiber 217B and an edge-mounted optical fiber 217A. In other embodiments, only vertically-mounted optical fibers 217B or only edge-mounted optical fibers 217A are coupled to the photonic package 100, or another number of vertically-mounted optical fibers 217B or edge-mounted optical fibers 217A are coupled to the photonic package 100. The optical fibers 217 (e.g., 217A and 217B) may be mounted to the photonic package 100 using an optical glue 215 or the like.

In some embodiments, the vertically-mounted optical fiber 217B may be configured to optically couple to a grating coupler within the photonic package 100, such as the grating coupler 107. The vertically-mounted optical fiber 217B may be mounted at an angle with respect to the vertical axis or may be laterally offset from the grating coupler 107. The optical signals and/or optical power transmitted between the vertically-mounted optical fiber 217B and the grating coupler 107 are transmitted through the dielectric layer 108, the dielectric layer 115, the dielectric material 126, the adhesive layer 127, and the support 128 formed over the grating coupler 107, as illustrated by the light path 164. Optical signals may be transmitted from the optical fiber 217B to the grating coupler 107 and into the waveguides 104, wherein the optical signals may be detected by a photonic component 106 comprising a photodetector and transmitted as electrical signals into the electronic die 122. Optical signals generated within the waveguides 104 by a photonic component 106 comprising a modulator may similarly be transmitted from the grating coupler 107 to the vertically-mounted optical fiber 217B. Mounting the optical fiber 217B in a vertical orientation may allow for improved optical coupling, reduced processing cost, or greater design flexibility of the photonic package 100 or the semiconductor package 500.

In some embodiments, the edge-mounted optical fiber 217A is configured to optically couple to an edge coupler within the interposer 50, such as the edge coupler 24. The edge coupler 24 may be located near an edge or sidewall of the interposer 50. The edge-mounted optical fiber 217A may be mounted at an angle with respect to the horizontal axis or may be vertically offset from the edge coupler 24. The optical signals and/or optical power transmitted between the edge-mounted optical fiber 217A and the edge coupler 24 may be transmitted through a dielectric layer (e.g., dielectric layer 15). For example, optical signals may be transmitted from the edge-mounted optical fiber 217A to the edge coupler 24 and into the nitride waveguide 21. In some embodiments, a single optical fiber 217A may be coupled into more than one nitride waveguides 21 (see, e.g., 21A, 21B, and 21C in FIG. 23). In this manner, the photonic package 100 or the semiconductor package 500 as described herein may be coupled to optical fibers 217 in different configurations, allowing for greater flexibility of design.

In the example of FIG. 25A, a portion of the molding material 211 proximate to the edge-mounted optical fiber 217A is replaced by an index matching material 213. In some embodiments, the index matching material 213 is used to reduce or prevent light loss for light coming from or going into the edge-mounted optical fiber 217A. For example, the dielectric layers 15/23 may be oxide layers having a refractive index of 1.4, the molding material 211 may be an SOG material or an organic material with a refractive index other than 1.4 (e.g., larger than 1.4). To prevent light loss into the molding material 211, the index matching material 213 with a refractive index (e.g., 1.4) matching that of the dielectric layers 15/23 is used. In some embodiments, a thickness of the index matching material 213, measured along the vertical direction of FIG. 25A, is at least 6 μm. A thickness T of the portion of the dielectric layer 15 under the nitride waveguide 21 may be as large as 7 μm, as an example. In some embodiments where the refractive index of the molding material 211 matches that of the dielectric layer 15, the index matching material 213 is omitted. The semiconductor package 500 may be bonded to another substrate (e.g., a PCB board) through the conductive connectors 27 of the interposer 50.

Figure 25B:
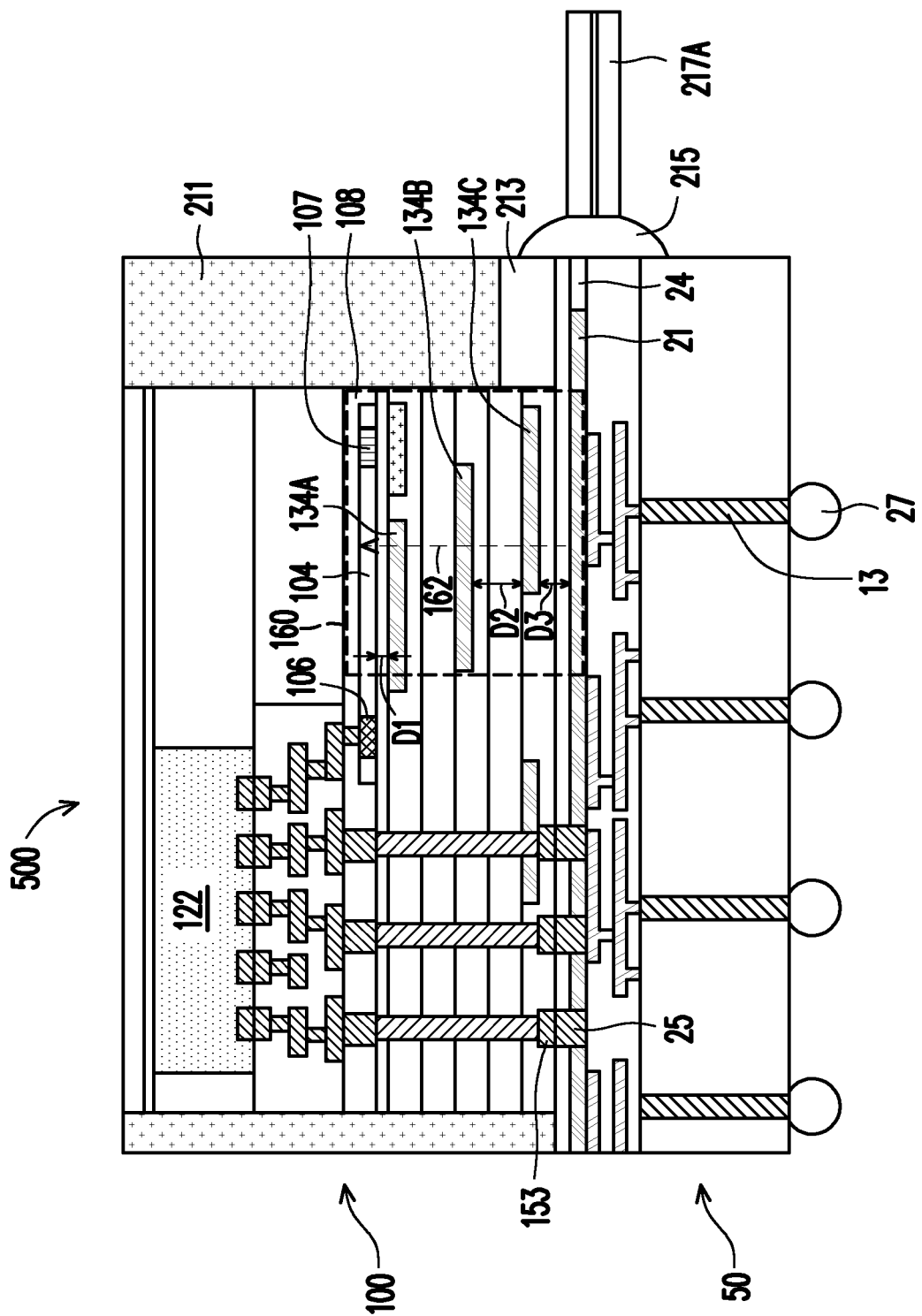

FIG. 25B illustrates a zoomed-in view of a portion of the semiconductor package 500 showing a portion of the photonic package 100 and a portion of the interposer 50 in FIG. 25A. As illustrated in FIG. 25B, optical through-via 160 is formed in the semiconductor package 500, which optical through-via 160 includes silicon waveguides 104 and nitride waveguides 134 of the photonic package 100, and the nitride waveguide 21 of the interposer 50. When the horizontal distances between neighboring waveguides (e.g., 104, 134, 21) are small, e.g., when there is lateral overlapping, and also when the vertical distances D1, D2, and D3 between neighboring waveguides (e.g., 104, 134, 21) are small, light may optically inter-couple between the neighboring waveguides (e.g., 104, 134, 21). Accordingly, the light in the nitride waveguide 21 may be optically coupled to the overlying silicon waveguides 104 through the nitride waveguides 134 along the light path 162.

To effectively inter-couple light, the neighboring waveguides (e.g., 104, 134 and 21) in the optical through-via 160 have small distances to achieve effective optical-coupling and low light loss. For example, the vertical distance D1 between the silicon waveguide 104 and its neighboring nitride waveguides 134 may be smaller than about 2,000 Å. The vertical distance D2 between neighboring nitride waveguides 134 may be smaller than about 2 m. The vertical distance D3 between the nitride waveguide 134C and the nitride waveguide 21 may be smaller than about 2 m. Also, for effective light transferring, all materials in the light paths including the dielectric layers may be light-transparent, and may have refractive index smaller than that of silicon nitride. For example, some or all of these dielectric layers may be formed of or comprise silicon oxide.

Figure 25D:
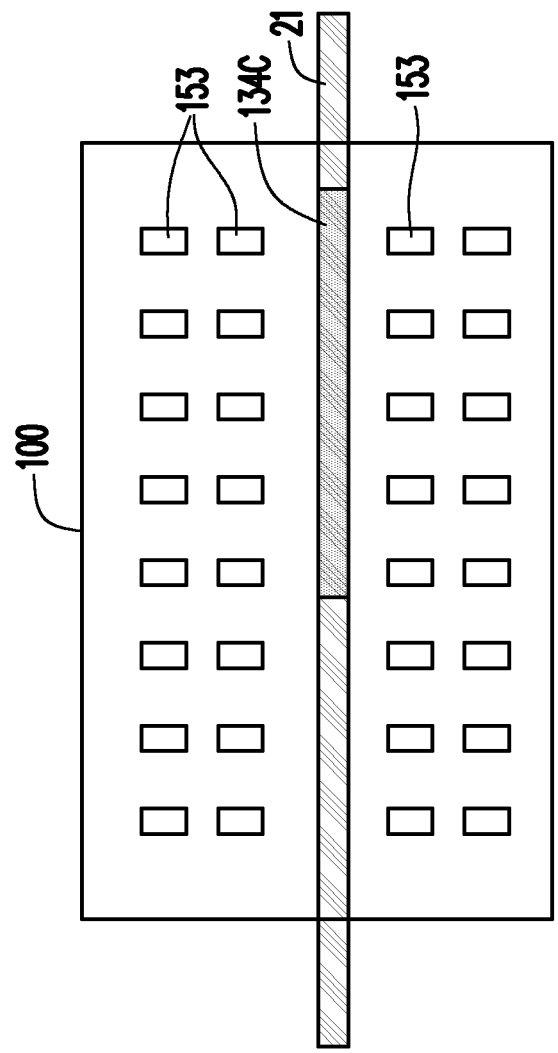
Figure 25C:
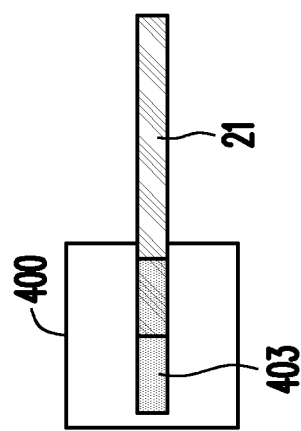

FIGS. 25C and 25D illustrate plan views of portions of the semiconductor package 500. In particular, FIG. 25C shows the sidewalls of the laser diode 400, the light emitting layer 403 of the laser diode 400, and the nitride waveguide 21 of the interposer 50. FIG. 25D shows the sidewalls of the photonic package 100, the conductive pads 153 of the photonic package 100, the bottommost nitride waveguide 134C of the photonic package 100, and the nitride waveguide 21 of the interposer 50. Note that for simplicity, not all features are illustrated in FIGS. 25C and 25D. As illustrated in FIG. 25C, the light emitting layer 403 of the laser diode 400 overlaps with at least a portion of the underlying nitride waveguide 21. Similarly, FIG. 25D shows that the bottommost nitride waveguide 134C of the photonic package 100 overlaps with the nitride waveguide 21 of the interposer 50.

Figure 26:
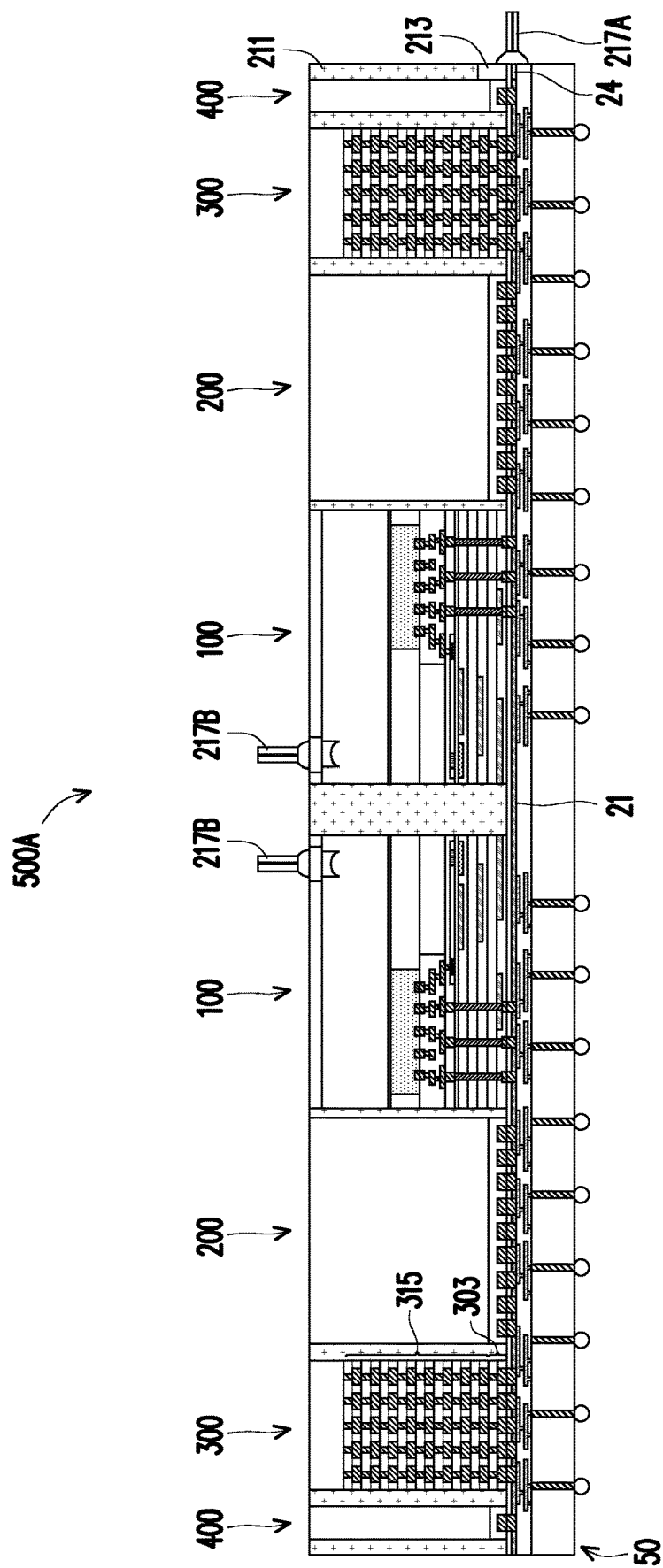
FIG. 26 illustrates a cross-sectional view of a semiconductor package, in accordance with an embodiment.

FIG. 26 illustrates a cross-sectional view of a semiconductor package 500A, in accordance with an embodiment. The semiconductor package 500A is similar to the semiconductor package 500 of FIG. 25A, but with multiple photonic packages 100 bonded to the interposer 50. Each photonic package 100 has a respective semiconductor device 200 (e.g., a CPU, or a controller), a semiconductor device 300 (e.g., a memory device), and a laser diode 400 attached to the interposer 50. The semiconductor device 300 illustrated in FIG. 26 is a memory device. FIG. 26 shows memory cells 315 formed in/on the substrate of the semiconductor device 300 and the interconnect structure 303 of the semiconductor device 300. For simplicity, the laser diodes 400 in FIG. 26 show less details than FIG. 25A.

In the example of FIG. 26, the photonic packages 100 and the laser diodes 400 in the semiconductor package 500A are optically coupled to the nitride waveguide 21 of the interposer 50, such that optical signals can be communicated between the photonic packages 100, between a photonic package 100 and a laser diode 400, and between the semiconductor package 500A and an external device (not shown) through the optical fibers 217 (e.g., 217A, or 217B). Therefore, the nitride waveguide 21 serves as a "data bus" optically coupled to all optical components (e.g., 100, 400) of the semiconductor package 500A to facilitate optical communication between the optical components of the semiconductor package 500A.

Figure 27:
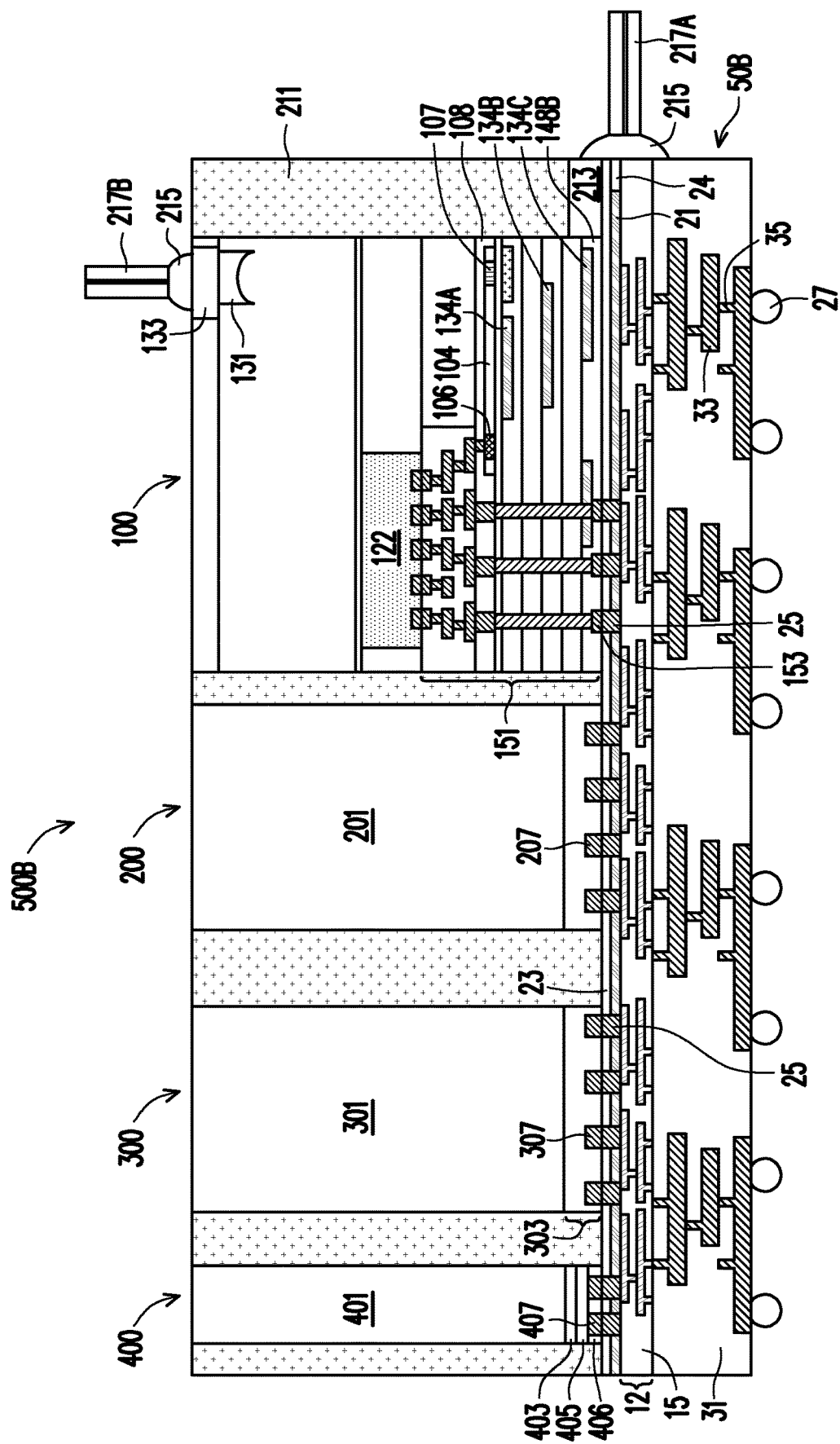
FIG. 27 illustrates a cross-sectional view of a semiconductor package, in accordance with another embodiment.

FIG. 27 illustrates a cross-sectional view of a semiconductor package 500B, in accordance with another embodiment. The semiconductor package 500B is similar to the semiconductor package 500 of FIG. 25A, but with the interposer 50 replaced by the interposer 50B of FIG. 24.

Figure 28:
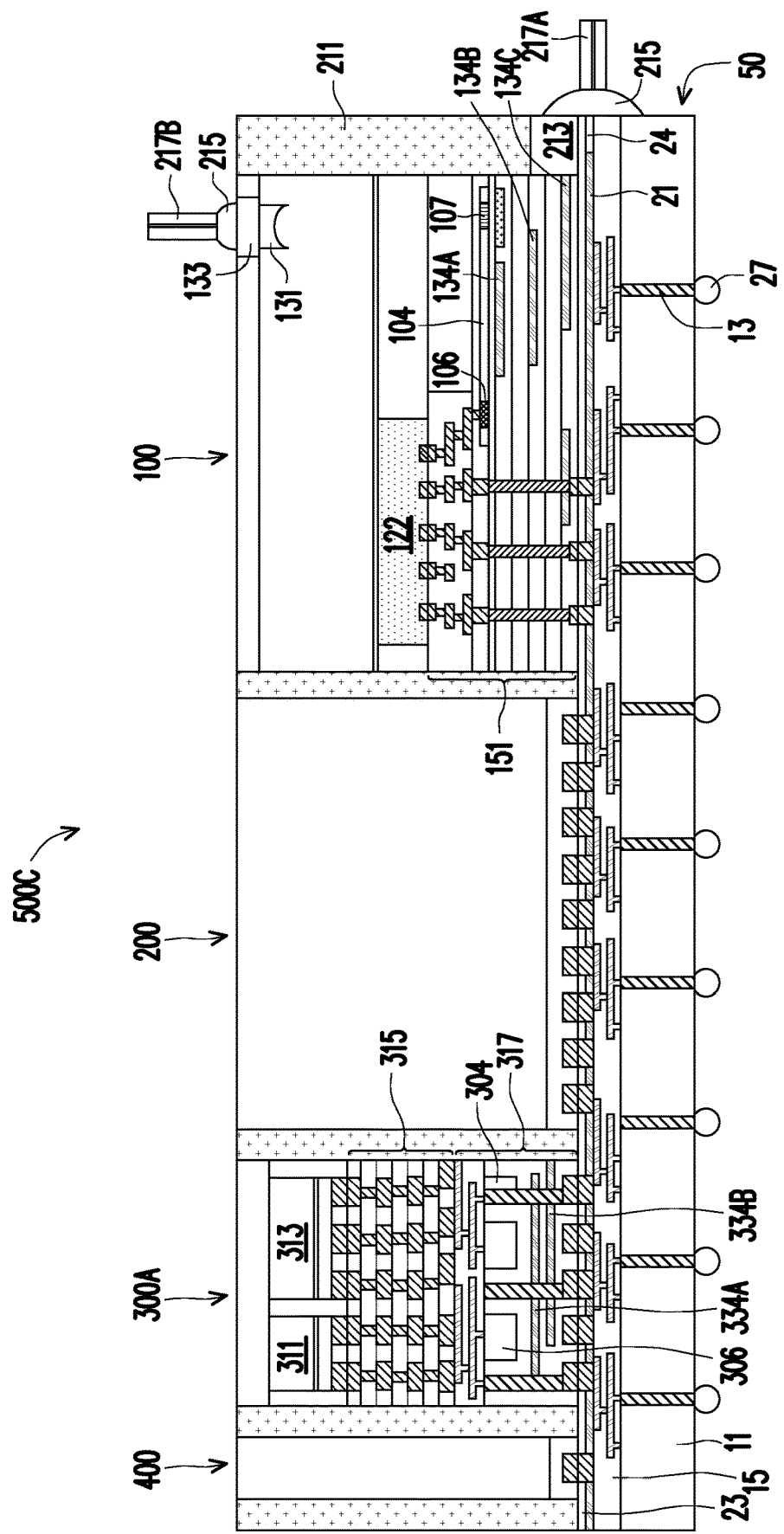
FIG. 28 illustrates a cross-sectional view of a semiconductor package, in accordance with another embodiment.

FIG. 28 illustrates a cross-sectional view of a semiconductor package 500C, in accordance with another embodiment. The semiconductor package 500C is similar to the semiconductor package 500 of FIG. 25A, but with the semiconductor device 300 replaced with a semiconductor device 300A. The semiconductor device 300A is a memory device that includes memory cells 315, a first electronic die 311 (e.g., a CPU) and a second electronic die 313 (e.g., a memory controller) over the memory cells 315, and a photonic die 317 below the memory cells 315. The photonic die 317 is similar to the photonic die 151 of the photonic package 100. For example, the photonic die 317 includes a redistribution structure, a silicon waveguide 304, a photonic component 306 (e.g., photodetector or modulator), and nitride waveguides 334A and 334B. The lowermost nitride waveguide 334B is optically coupled to the nitride waveguide 21 of the interposer 50. The nitride waveguides 21, 334A, 334B and the silicon waveguide 304 form an optical through-via that optically couples the nitride waveguide 21 and the silicon waveguide 304.

Figure 29:
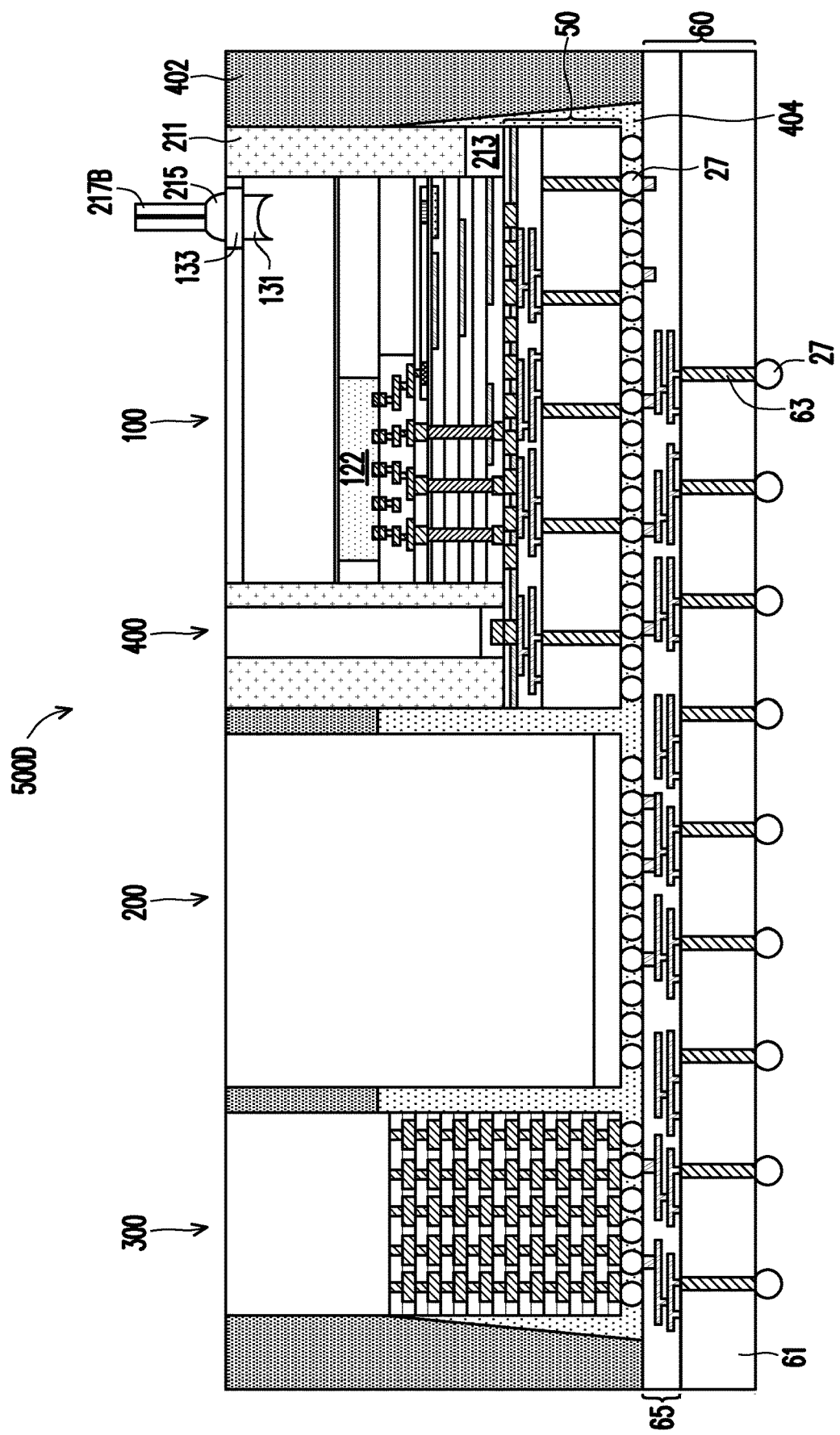
FIG. 29 illustrates a cross-sectional view of a semiconductor package, in accordance with another embodiment.

FIG. 29 illustrates a cross-sectional view of a semiconductor package 500D, in accordance with another embodiment. In FIG. 29, the photonic package 100 and a laser diode 400 are bonded to the interposer 50 to form a semiconductor structure, which in turn is bonded to an interposer 60 through conductive connectors 27 of the interposer 50. The interposer 60 is similar to the interposer 50, but without the nitride waveguide 21. For example, the interposer 60 includes a substrate 61, TSVs 63, and a redistribution structure 65 over the substrate 61. FIG. 29 further illustrates a semiconductor device 200 (e.g., a processor) and a semiconductor device 300 (e.g., a memory device) bonded to the interposer 60. An underfill material 404 is formed between the interposer 50 and the interposer 60, and between the semiconductor devices 200/300 and the interposer 60. A molding material 402 is formed over the interposer 60 around the semiconductor devices 200/300, and around the semiconductor structure comprising the interposer 50, the laser diode 400 and the photonic package 100.

Figure 30:
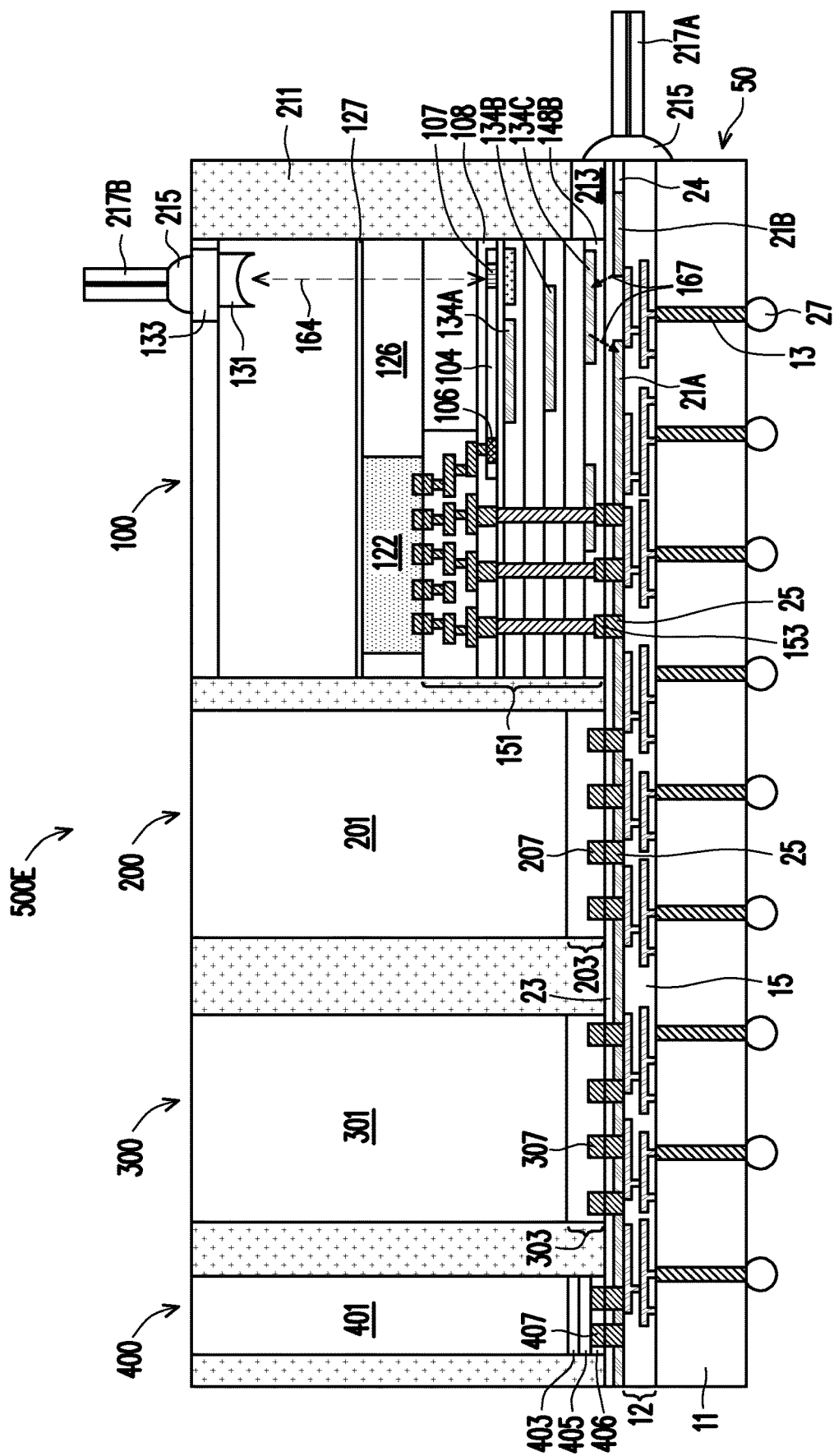
FIG. 30 illustrates a cross-sectional view of a semiconductor package, in accordance with yet another embodiment.

FIG. 30 illustrates a cross-sectional view of a semiconductor package 500E, in accordance with yet another embodiment. The semiconductor package 500E is similar to the semiconductor package 500 of FIG. 25A, but the interposer 50 includes multiple, separate, nitride waveguides. In the example of FIG. 30, two separate nitride waveguides 21A and 21B are shown on the upper surface of the redistribution structure 12. In some embodiments, the lateral distance between the nitride waveguides 21A and 21B is too large for direct optical coupling between them. Note that the nitride waveguide 134C of the photonic package 100 is proximate to both nitride waveguides 21A and 21B and laterally overlaps with both nitride waveguides 21A and 21B. Therefore, the nitride waveguide 134C is optically coupled to both nitride waveguides 21A and 21B. A light signal in the nitride waveguide 21B may be indirectly coupled to the nitride waveguide 21A by travelling upward to the nitride waveguide 134C first, then travelling downward from the nitride waveguide 134C to the nitride waveguide 21A, as illustrated by the light path 167. Therefore, FIG. 30 illustrates that the nitride waveguide 21 of the interposer 50 does not have to extend continuously across the full length (or width) of the interposer 50, and instead, could include multiple, separate segments.

Figure 31:
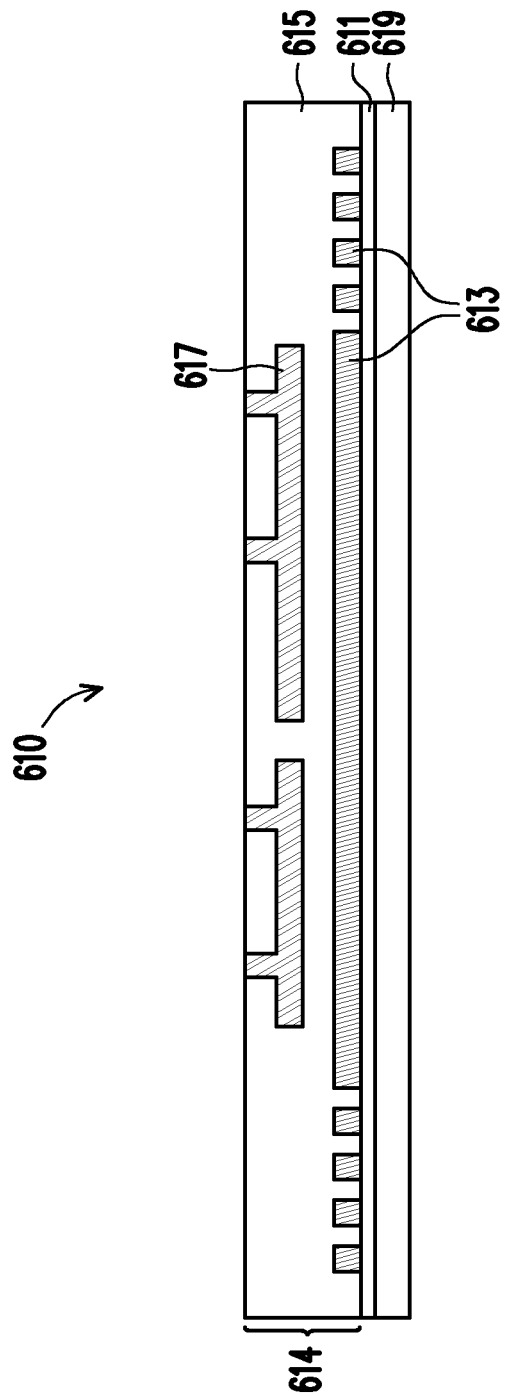
FIG. 31 illustrates a cross-sectional view of an optical local silicon interconnect (OLSI), in accordance with an embodiment.

FIG. 31 illustrates a cross-sectional view of an optical local silicon interconnect (OLSI) 610, in accordance with an embodiment. The OLSI 610 includes a substrate 619, which may be the same as or similar to the substrate 102C in FIG. 1. For example, the substrate 619 may be formed of glass, ceramic, dielectric, a semiconductor material (e.g., Si), the like, or a combination thereof. A dielectric layer 611 (e.g., a silicon oxide layer) is formed over the substrate 619, and a waveguide 613 (e.g., a silicon waveguide) is formed over the dielectric layer 611. Additional optical components, such as photodetectors, modulators, grating couplers, and the like, may also be formed in the same layer with the waveguide 613. One or more dielectric layers 615 (e.g., silicon oxide layers) are formed over the waveguide 613. Conductive features 617, which includes conductive lines and vias, are formed in the one or more dielectric layers 615 to form a redistribution structure 614 having a waveguide 613. In some embodiments, the OLSI 610 is formed using the same processing for forming the interconnect structure of a semiconductor die in the back-end-of-line (BEOL) processing, and therefore, the critical dimension (e.g., line width, or line pitch) of the OLSI 610 is the same as that of the interconnect structure to allow for high-density routing.

Figure 32:
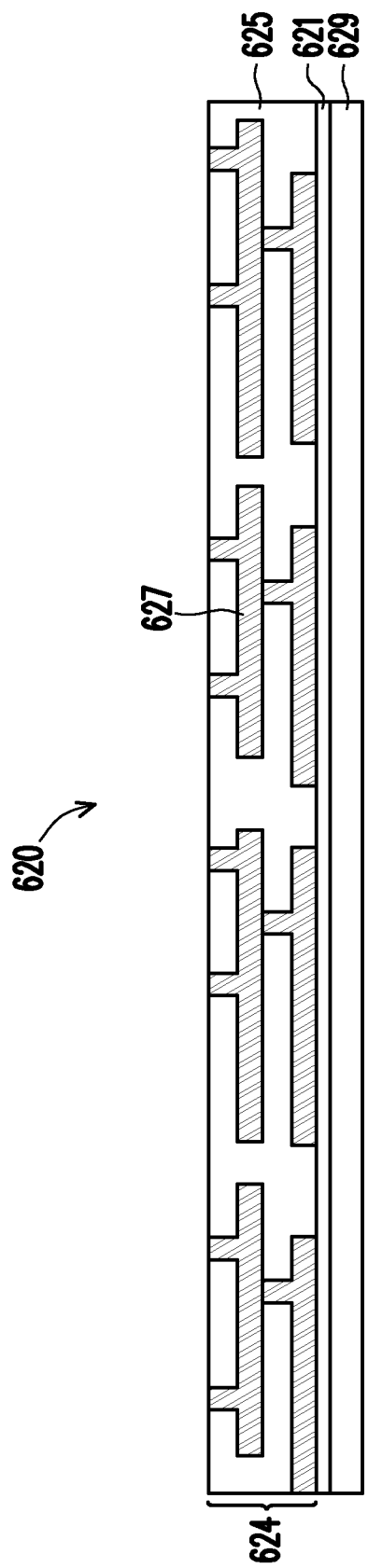
FIG. 32 illustrates a cross-sectional view of a local silicon interconnect (LSI), in accordance with an embodiment.

FIG. 32 illustrates a cross-sectional view of a local silicon interconnect (LSI) 620, in accordance with an embodiment. The LSI 620 is similar to the OLSI 610 in FIG. 31, but without the waveguide 613 formed. The LSI 620 includes a substrate 629 (e.g., Si), a dielectric layer 621 (e.g., silicon oxide), and a redistribution structure 624 that includes one or more dielectric layers 625 (e.g., silicon oxide) and conductive features 627. Details are the same as or similar to those of OLSI 610, thus not repeated here.

Figure 33:
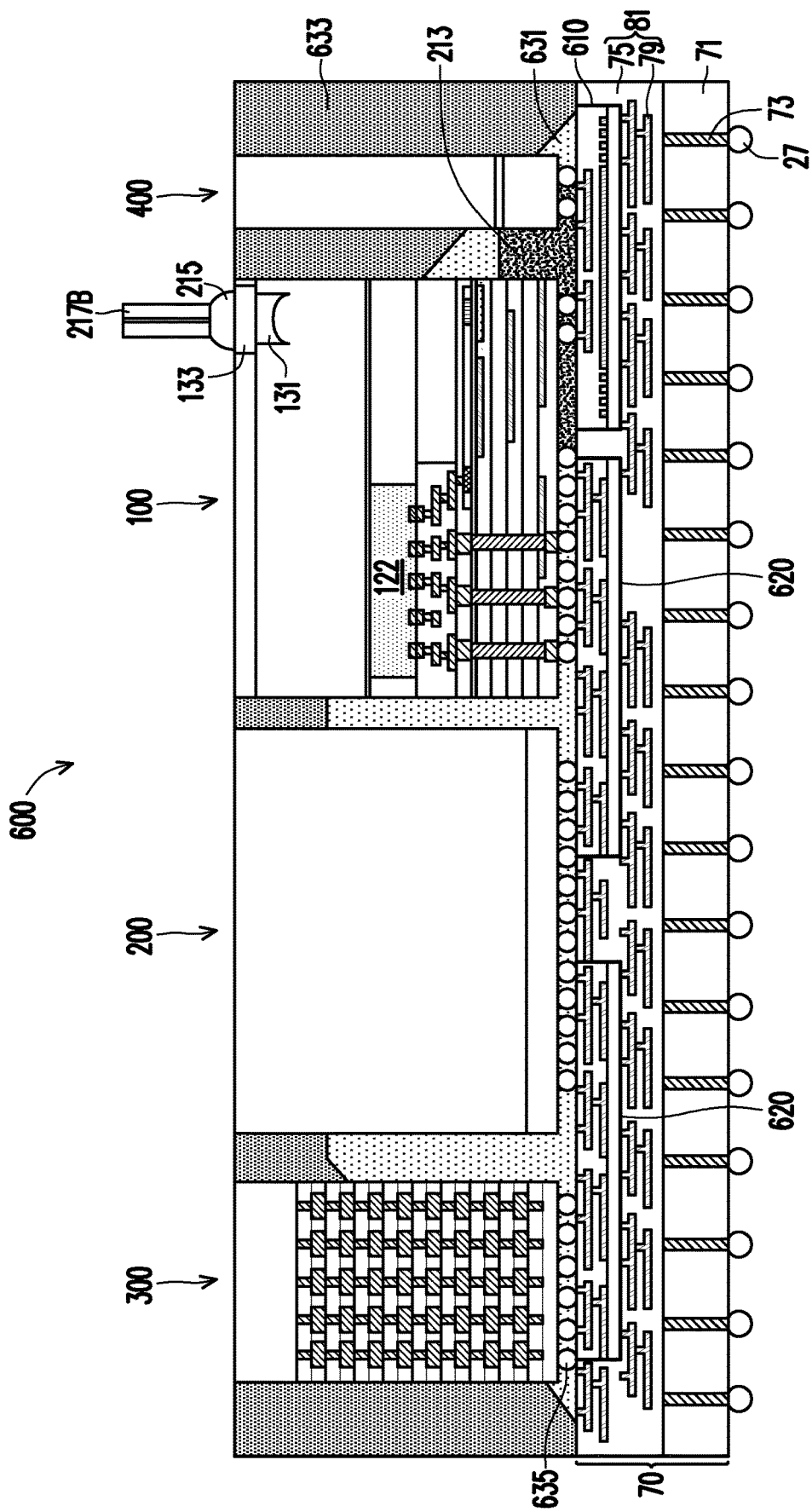
FIG. 33 illustrates a cross-sectional view of a semiconductor package, in accordance with an embodiment.

FIG. 33 illustrates a cross-sectional view of a semiconductor package 600, in accordance with an embodiment. The semiconductor package 600 includes the photonic package 100, the semiconductor device 200 (e.g., a processor), the semiconductor device 300 (e.g., a memory device), and the laser diode 400 bonded to an interposer 70. The interposer 70 includes a substrate 71 with TSVs 73 extending through the substrate 71. The substrate 71 is the same as or similar to the substrate 11 of FIG. 25A, thus details are not repeated. One or more layers of an organic material 75 (e.g., a polymer material such as polyimide) is formed over the substrate 71, and conductive features 79 (e.g., conductive lines and vias) are formed in the one or more layers of organic material 75 to form a redistribution structure 81. Notably, two LSIs 620 and an OLSI 610, which are pre-formed, are embedded (e.g., encapsulated) in the organic material 75 at the upper surface of the redistribution structure 81. The OLSI 610 is disposed under the laser diode 400 and the photonic package 100. The laser diode 400 and the photonic package 100 are both optically coupled to the waveguide 613 of the OLSI 610 to enable optical communication between them. In addition, the laser diode 400 and the photonic package 100 are electrically coupled to the redistribution structure 614 of the OLSI 610 through conductive connectors 635.

Still referring to FIG. 33, one of the LSIs 620 is disposed under the photonic package 100 and the semiconductor device 200, and the redistribution structure 624 of the LSI 620 is electrically coupled to the photonic package 100 and the semiconductor device 200 through the conductive connectors 635. Another LSI 620 is disposed under the semiconductor device 200 and the semiconductor device 300, and the redistribution structure 624 of the another LSI 620 is electrically coupled to the semiconductor devices 200 and 300 through the conductive connectors 635. The LSIs 620 and the OLSI 610 have smaller feature sizes (e.g., line widths, line pitches) than the conductive features 79 (because processes of the organic material 75 have larger critical dimensions) of the redistribution structure 81, thereby allowing for higher-density routing than what is available for the redistribution structure 81.

As illustrated in FIG. 33, an underfill material 631 is formed to fills the gap between the interposer 70 and the semiconductor devices 200/300, the laser diode 400, and the photonic package 100. A molding material 633 is formed over the interposer 70 around the semiconductor devices 200/300, the laser diode 400, and the photonic package 100. In some embodiments, the index matching material 213 is formed on the interposer 70 between the laser diode 400 and the photonic package 100, between the interposer 70 and the laser diode 400, and between the interposer 70 and the photonic package 100. The semiconductor package 600 may be bonded to another substrate (e.g., a PCB board) through the conductive connectors 27 of the interposer 70.

Embodiments may achieve advantages. For example, the interposer (e.g., 50, 50A, 50B) with nitride waveguide 21 supports routing of both electrical signal and optical signal, and allows easy integration of various types of devices in the semiconductor package. Without the nitride waveguide 21 on the interposer, the photonic package 100 would have to communicate with the semiconductor devices 200/300 through electrical signals only. As the data rate increases and the routing density increases, electrical signals transmitted between the photonic package 100 and the semiconductor devices 200/300 get degraded through the conductive connectors and copper traces. With the disclosed embodiments, the interposer with built-in waveguide allows for high-speed optical signaling with power and performance enhancement. The disclosed interposers allow highly efficient edge coupler to be used in the optical systems, and enable heterogeneous integration of III-V devices or devices of other material systems. With the precision of die-to-wafer bonding, the integration structure can provide very low coupling loss for heterogeneous integration of III-V devices to silicon-photonic dies. In addition, the use of organic material in the interposer not only reduces cost, but also allow for integration of LSI and/or OLSI for high-density, high-speed routing between devices bonded to the interposer.

Figure 34:
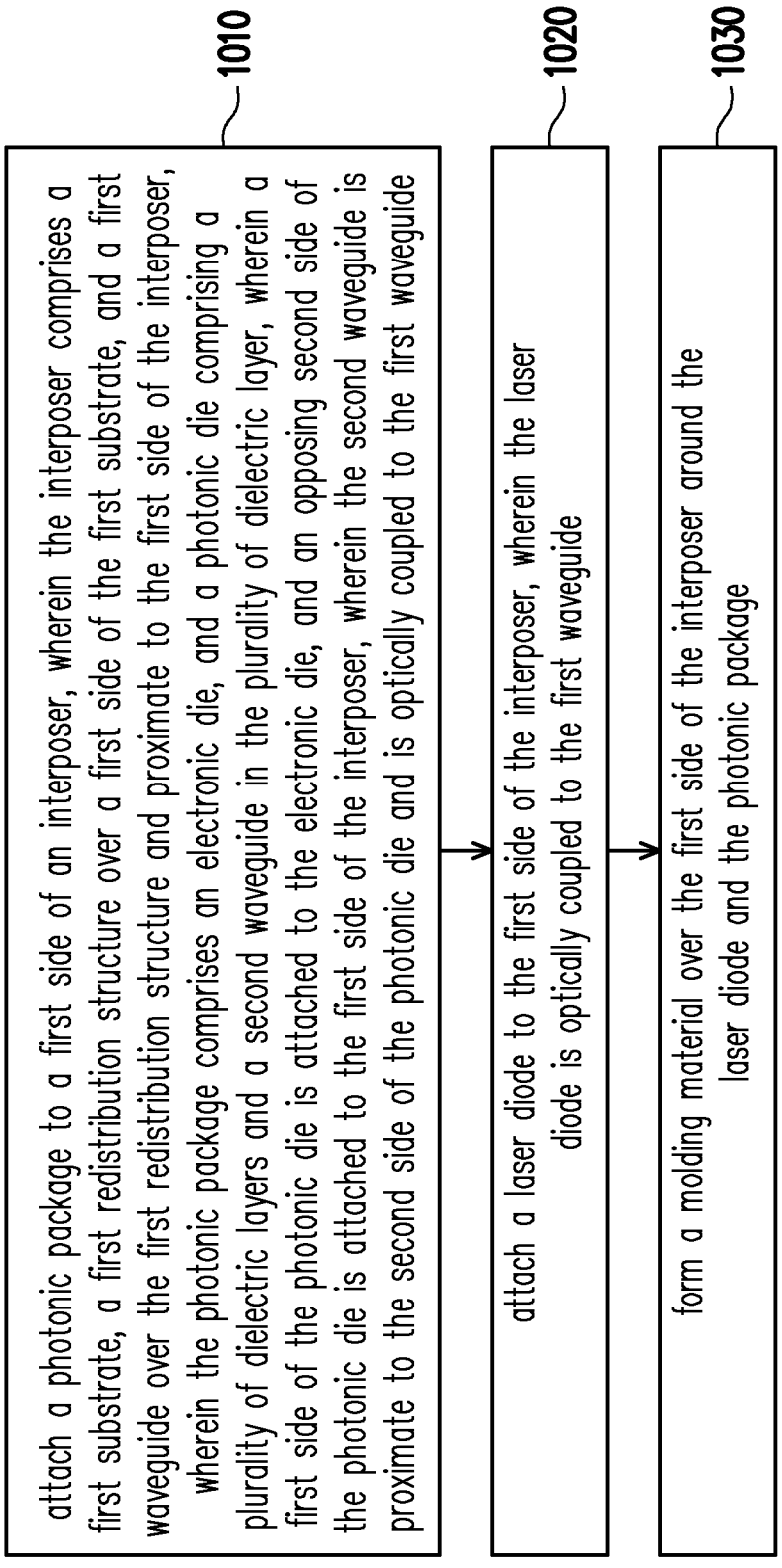
FIG. 34 illustrates a method of forming a semiconductor package, in accordance with an embodiment.

FIG. 34 illustrates a flow chart of a method 1000 of forming a semiconductor package, in accordance with some embodiments. It should be understood that the embodiment method shown in FIG. 34 is merely an example of many possible embodiment methods. One of ordinary skill in the art would recognize many variations, alternatives, and modifications. For example, various steps as illustrated in FIG. 34 may be added, removed, replaced, rearranged, or repeated.

Referring to FIG. 34, at block 1010, a photonic package is attached to a first side of an interposer, wherein the interposer comprises a first substrate, a first redistribution structure over a first side of the first substrate, and a first waveguide over the first redistribution structure and proximate to the first side of the interposer, wherein the photonic package comprises an electronic die, and a photonic die comprising a plurality of dielectric layers and a second waveguide in the plurality of dielectric layer, wherein a first side of the photonic die is attached to the electronic die, and an opposing second side of the photonic die is attached to the first side of the interposer, wherein the second waveguide is proximate to the second side of the photonic die and is optically coupled to the first waveguide. At block 1020, a laser diode is attached to the first side of the interposer, wherein the laser diode is optically coupled to the first waveguide. At block 1030, a molding material is formed over the first side of the interposer around the laser diode and the photonic package.

In accordance with an embodiment, a semiconductor package includes a first interposer comprising: a first substrate; a first redistribution structure over a first side of the first substrate; and a first waveguide over the first redistribution structure and proximate to a first side of the first interposer, wherein the first redistribution structure is between the first substrate and the first waveguide. The semiconductor package further includes a photonic package attached to the first side of the first interposer, wherein the photonic package comprises: an electronic die; and a photonic die comprising a plurality of dielectric layers and a second waveguide in one of the plurality of dielectric layers, wherein a first side of the photonic die is attached to the electronic die, and an opposing second side of the photonic die is attached to the first side of the first interposer, wherein the second waveguide is proximate to the second side of the photonic die. In an embodiment, the first waveguide of the first interposer is optically coupled to the second waveguide of the photonic die. In an embodiment, the first interposer further comprises a dielectric layer over the first waveguide, wherein the first waveguide is between the dielectric layer and the first redistribution structure, wherein a refractive index of the dielectric layer is lower than that of the first waveguide. In an embodiment, the photonic die further comprises: a second redistribution structure between the plurality of dielectric layers and the electronic die, wherein the second redistribution structure is electrically coupled to the electronic die; a third waveguide in a topmost dielectric layer of the plurality of dielectric layers closest to the second redistribution structure, wherein the third waveguide is optically coupled to the second waveguide; a photonic device in the topmost dielectric layer and optically coupled to the third waveguide, wherein the photonic device is electrically coupled to the second redistribution structure; and conductive vias in the plurality of dielectric layers and electrically coupled to the second redistribution structure. In an embodiment, the first waveguide and the second waveguide are nitride waveguides, and the third waveguide is a silicon waveguide. In an embodiment, the photonic die further comprises a fourth waveguide in the plurality of dielectric layers and disposed between the second waveguide and the third waveguide, wherein the third waveguide is optically coupled to the second waveguide through the fourth waveguide. In an embodiment, the photonic package further comprises: a supporting substrate over the electronic die, wherein the electronic die is between the supporting substrate and the photonic die; and a micro lens in the supporting substrate, wherein the semiconductor package further comprises an optical fiber attached to the supporting substrate over the micro lens. In an embodiment, the semiconductor package further comprises a laser diode attached to the first side of the first interposer, wherein the laser diode is optically coupled to the first waveguide of the first interposer. In an embodiment, the semiconductor package further comprises: a second interposer, wherein a first side of the second interposer is attached to a second side of the first interposer opposing the first side of the first interposer; a memory device attached to the first side of the second interposer; and a second electronic die attached to the first side of the second interposer. In an embodiment, the semiconductor package further comprises: a memory device attached to the first side of the first interposer, wherein the memory device is electrically coupled to the first redistribution structure of the first interposer; and a second electronic die attached to the first side of the first interposer, wherein the second electronic die is electrically coupled to the first redistribution structure of the first interposer. In an embodiment, the memory device has a third waveguide proximate to a first side of the memory device facing the first interposer, wherein the third waveguide is optically coupled to the first waveguide. In an embodiment, the semiconductor package further comprises an optical fiber attached to a sidewall of the first interposer, wherein the optical fiber is optically coupled to the first waveguide of the first interposer. In an embodiment, the photonic package further comprising a second photonic die between the electronic die and the photonic die, wherein the photonic die is attached to the electronic die through the second photonic die.

In accordance with an embodiment, a semiconductor package includes an interposer comprising: a substrate; a first redistribution structure over a first side of the substrate; a first waveguide over the first redistribution structure; and a dielectric layer over the first waveguide. The semiconductor package further includes a photonic package attached to a first side of the interposer, wherein the photonic package comprises: an electronic die; and a photonic die, wherein a first side of the photonic die is attached to the dielectric layer of the interposer, and a second side of the photonic die is attached to the electronic die, wherein the photonic die comprises: a second redistribution structure attached to the electronic die; a plurality of dielectric layers between the second redistribution structure and the interposer; a second waveguide in the plurality of dielectric layers proximate to the interposer, wherein the second waveguide is optically coupled to the first waveguide; and vias in the plurality of dielectric layers, wherein the vias electrically couple the second redistribution structure to the first redistribution structure. In an embodiment, the semiconductor package further comprises an optical fiber attached to a sidewall of the interposer, wherein the optical fiber is optically coupled to the first waveguide of the interposer. In an embodiment, the semiconductor package further comprises a laser diode attached to the first side of the interposer, wherein the laser diode is optically coupled to the first waveguide of the interposer. In an embodiment, the substrate of the interposer comprises an organic material. In an embodiment, the photonic package further comprises a third waveguide in the plurality of dielectric layers proximate to the electronic die, wherein the third waveguide is optically coupled to the second waveguide.

In accordance with an embodiment, a method of forming a semiconductor package includes: attaching a photonic package to a first side of an interposer, wherein the interposer comprises a first substrate, a first redistribution structure over a first side of the first substrate, and a first waveguide over the first redistribution structure and proximate to the first side of the interposer, wherein the photonic package comprises an electronic die, and a photonic die comprising a plurality of dielectric layers and a second waveguide in the plurality of dielectric layer, wherein a first side of the photonic die is attached to the electronic die, and an opposing second side of the photonic die is attached to the first side of the interposer, wherein the second waveguide is proximate to the second side of the photonic die and is optically coupled to the first waveguide; attaching a laser diode to the first side of the interposer, wherein the laser diode is optically coupled to the first waveguide; and forming a molding material over the first side of the interposer around the laser diode and the photonic package. In an embodiment, the method further comprises, before forming the molding material: attaching a memory device to the first side of the interposer; and attaching a second electronic die to the first side of the interposer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor package comprising:
   a first interposer comprising:
      a first substrate;
      a first redistribution structure over a first side of the first substrate; and
      a first waveguide over the first redistribution structure and proximate to a first side of the first interposer, wherein the first redistribution structure is between the first substrate and the first waveguide; and
   a photonic package attached to the first side of the first interposer, wherein the photonic package comprises:
      an electronic die; and
      a photonic die comprising a plurality of dielectric layers and a second waveguide in one of the plurality of dielectric layers, wherein a first side of the photonic die is attached to the electronic die, and an opposing second side of the photonic die is attached to the first side of the first interposer, wherein the second waveguide is proximate to the second side of the photonic die, wherein the second waveguide is further from the first substrate than the first waveguide, and the second waveguide laterally overlaps the first waveguide.

2. The semiconductor package of claim 1, wherein the first waveguide of the first interposer is optically coupled to the second waveguide of the photonic die.

3. The semiconductor package of claim 1, wherein the first interposer further comprises a dielectric layer over the first waveguide, wherein the first waveguide is between the dielectric layer and the first redistribution structure, wherein a refractive index of the dielectric layer is lower than that of the first waveguide.

4. The semiconductor package of claim 1, wherein the photonic die further comprises:
   a second redistribution structure between the plurality of dielectric layers and the electronic die, wherein the second redistribution structure is electrically coupled to the electronic die;
   a third waveguide in a topmost dielectric layer of the plurality of dielectric layers closest to the second redistribution structure, wherein the third waveguide is optically coupled to the second waveguide;
   a photonic device in the topmost dielectric layer and optically coupled to the third waveguide, wherein the photonic device is electrically coupled to the second redistribution structure; and
   conductive vias in the plurality of dielectric layers and electrically coupled to the second redistribution structure.

5. The semiconductor package of claim 4, wherein the first waveguide and the second waveguide are nitride waveguides, and the third waveguide is a silicon waveguide.

6. The semiconductor package of claim 4, wherein the photonic die further comprises a fourth waveguide in the plurality of dielectric layers and disposed between the second waveguide and the third waveguide, wherein the third waveguide is optically coupled to the second waveguide through the fourth waveguide.

7. The semiconductor package of claim 1, wherein the photonic package further comprises:
   a supporting substrate over the electronic die, wherein the electronic die is between the supporting substrate and the photonic die; and
   a micro lens in the supporting substrate, wherein the semiconductor package further comprises an optical fiber attached to the supporting substrate over the micro lens.

8. The semiconductor package of claim 1, further comprising a laser diode attached to the first side of the first interposer, wherein the laser diode is optically coupled to the first waveguide of the first interposer.

9. The semiconductor package of claim 8, further comprising:
   a second interposer, wherein a first side of the second interposer is attached to a second side of the first interposer opposing the first side of the first interposer;
   a memory device attached to the first side of the second interposer; and
   a second electronic die attached to the first side of the second interposer.

10. The semiconductor package of claim 1, further comprising:
    a memory device attached to the first side of the first interposer, wherein the memory device is electrically coupled to the first redistribution structure of the first interposer; and
    a second electronic die attached to the first side of the first interposer, wherein the second electronic die is electrically coupled to the first redistribution structure of the first interposer.

11. The semiconductor package of claim 10, wherein the memory device has a third waveguide proximate to a first side of the memory device facing the first interposer, wherein the third waveguide is optically coupled to the first waveguide.

12. The semiconductor package of claim 1, wherein the photonic package further comprising a second photonic die between the electronic die and the photonic die, wherein the photonic die is attached to the electronic die through the second photonic die.

13. A semiconductor package comprising:
    an interposer comprising:
       a substrate;
       a first redistribution structure over a first side of the substrate;
       a first waveguide over the first redistribution structure; and
       a dielectric layer over the first waveguide; and
    a photonic package attached to a first side of the interposer, wherein the photonic package comprises:
       an electronic die; and
       a photonic die, wherein a first side of the photonic die is attached to the dielectric layer of the interposer, and a second side of the photonic die is attached to the electronic die, wherein the photonic die comprises:
          a second redistribution structure attached to the electronic die, wherein the second redistribution structure comprises layers of a first dielectric material and comprises conductive lines and vias in the layers of the first dielectric material;
          a second dielectric material laterally adjacent to, and contacting, the second redistribution structure, wherein the second dielectric material is different from the first dielectric material, wherein the second dielectric material and the second redistribution structure have a same thickness;

a plurality of dielectric layers between the second redistribution structure and the interposer, and between the second dielectric material and the interposer;

a second waveguide in the plurality of dielectric layers proximate to the interposer, wherein the second waveguide is optically coupled to the first waveguide; and vias in the plurality of dielectric layers, wherein the vias electrically couple the second redistribution structure to the first redistribution structure.

14. The semiconductor package of claim 13, further comprising an optical fiber attached to a sidewall of the interposer, wherein the optical fiber is optically coupled to the first waveguide of the interposer.

15. The semiconductor package of claim 13, further comprising a laser diode attached to the first side of the interposer, wherein the laser diode is optically coupled to the first waveguide of the interposer.

16. The semiconductor package of claim 13, wherein the substrate of the interposer comprises an organic material and an optical local silicon interconnect (OLSI) embedded in the organic material, wherein the OLSI comprises:

another substrate; and a third redistribution structure over the another substrate, wherein the third redistribution structure comprises:
  layers of a third dielectric material;
  conductive lines and vias in the layers of the third dielectric material; and
  a third waveguide between the conductive lines and the another substrate.

17. The semiconductor package of claim 13, wherein the photonic package further comprises a third waveguide in the plurality of dielectric layers proximate to the electronic die, wherein the third waveguide is optically coupled to the second waveguide.

18. The semiconductor package of claim 13, wherein a first sidewall of the second redistribution structure is aligned with a first sidewall of the plurality of dielectric layers, wherein a second sidewall of the second redistribution structure contacts and extends along a first sidewall of the second dielectric material, wherein a second sidewall of the second dielectric material is aligned with a second sidewall of the plurality of dielectric layers.

19. The semiconductor package of claim 13, wherein the second waveguide extends further from the substrate than the first waveguide, and the second waveguide laterally overlaps the first waveguide.

20. A semiconductor package comprising:
  a first interposer comprising:
    a first substrate;
    a first redistribution structure over a first side of the first substrate;
    a first waveguide over the first redistribution structure, wherein the first redistribution structure is between the first substrate and the first waveguide; and
    a dielectric layer over the first waveguide, wherein the dielectric layer is at a first side of the first interposer; and
  a photonic package attached to the first side of the first interposer, wherein the photonic package comprises:
    an electronic die; and
    a photonic die comprising a plurality of dielectric layers and a second waveguide in one of the plurality of dielectric layers, wherein a first side of the photonic die is attached to the electronic die, and an opposing second side of the photonic die is attached to the first side of the first interposer, wherein the second waveguide is proximate to the second side of the photonic die, wherein the second waveguide is optically coupled to the first waveguide, wherein the second waveguide extends further from the first substrate than the first waveguide, and at least a portion of the second waveguide is disposed within lateral extents of the first waveguide.

* * * * *